(12) United States Patent
Tateishi et al.

(10) Patent No.: US 11,676,870 B2
(45) Date of Patent: Jun. 13, 2023

(54) METHOD OF DETERMINING THICKNESS OF MEMORY GATE ELECTRODE DURING DEVICE MANUFACTURE

(71) Applicant: RENESAS ELECTRONICS CORPORATION, Tokyo (JP)

(72) Inventors: Kounosuke Tateishi, Tokyo (JP); Hiroaki Mizushima, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 17/477,043

(22) Filed: Sep. 16, 2021

(65) Prior Publication Data

US 2022/0093618 A1 Mar. 24, 2022

(30) Foreign Application Priority Data

Sep. 18, 2020 (JP) .............................. JP2020-157052

(51) Int. Cl.
*H01L 21/66* (2006.01)
*H01L 29/423* (2006.01)

(52) U.S. Cl.
CPC .............. *H01L 22/12* (2013.01); *H01L 22/34* (2013.01); *H01L 29/42328* (2013.01)

(58) Field of Classification Search
CPC .... H01L 22/12; H01L 22/14; H01L 22/30–34
See application file for complete search history.

(56) References Cited

U.S. PATENT DOCUMENTS

| | | |
|---|---|---|
| 6,180,461 B1 | 1/2001 | Ogura |
| 2016/0163876 A1 | 6/2016 | Wu et al. |
| 2019/0088561 A1 | 3/2019 | Lin et al. |
| 2019/0326311 A1 | 10/2019 | Chakihara |

FOREIGN PATENT DOCUMENTS

JP 2014-154665 A 8/2014

OTHER PUBLICATIONS

Extended European Search Report issued in European Patent Application No. 21194905.2-1212, dated Feb. 16, 2022.

*Primary Examiner* — Robert G Bachner
*Assistant Examiner* — Molly K Reida
(74) *Attorney, Agent, or Firm* — McDermott Will & Emery LLP

(57) ABSTRACT

A stacked-layer body including a gate insulating film and a control gate electrode is formed in a product region and a scribe region. Next, a gate insulating film and a conductive film are so formed that the stacked-layer body is covered. Next, an etching process is so performed to the conductive film that an upper surface of the conductive film is lower than that of an upper surface of the stacked-layer body, thereby forming a measurement pattern in the scribe region. Next, a memory gate electrode is formed by patterning the conductive film in the product region. Next, a silicide layer is formed on an upper surface of the memory gate electrode in the product region in a state where an upper surface of the measurement pattern is covered by an insulating film. Next, a resistance value of the measurement pattern covered by the insulating film is measured.

10 Claims, 24 Drawing Sheets

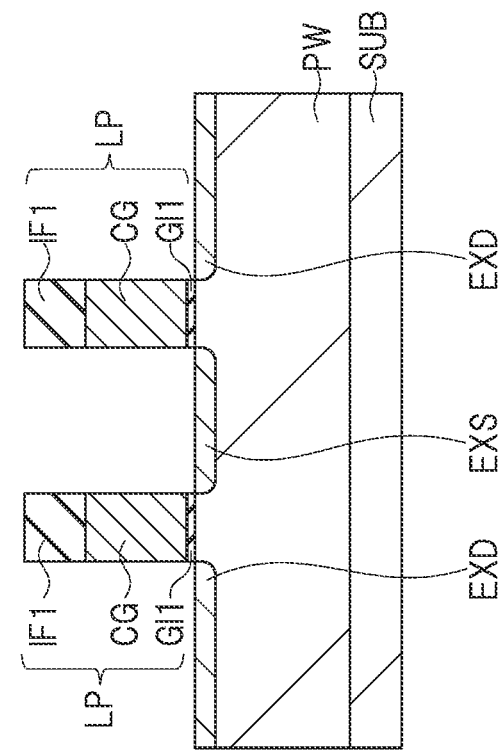
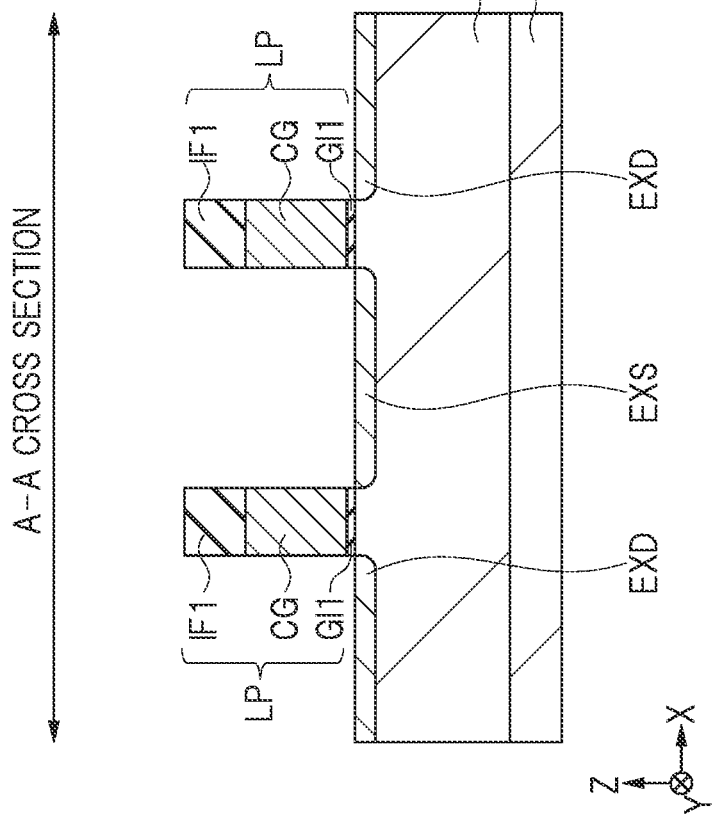
FIG. 3

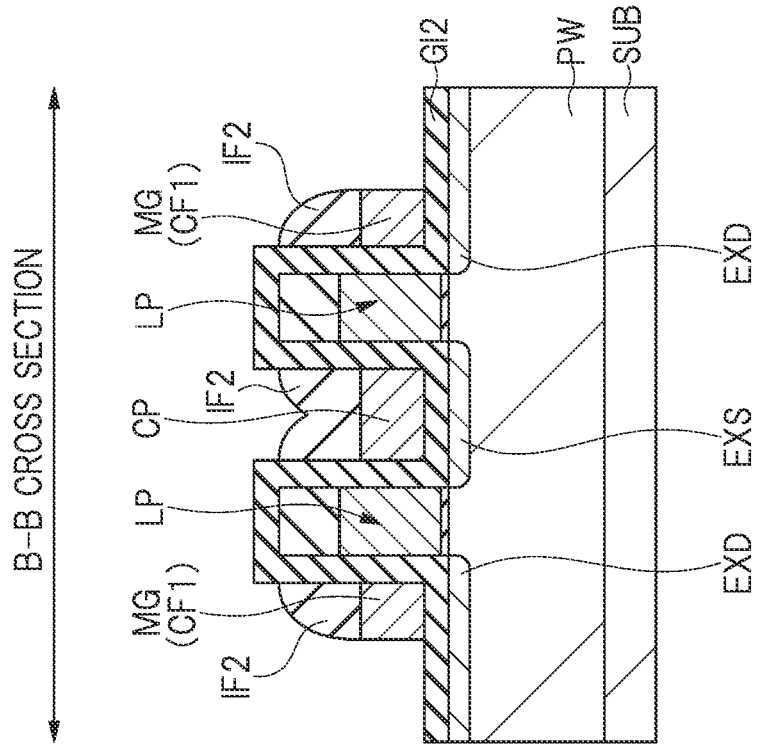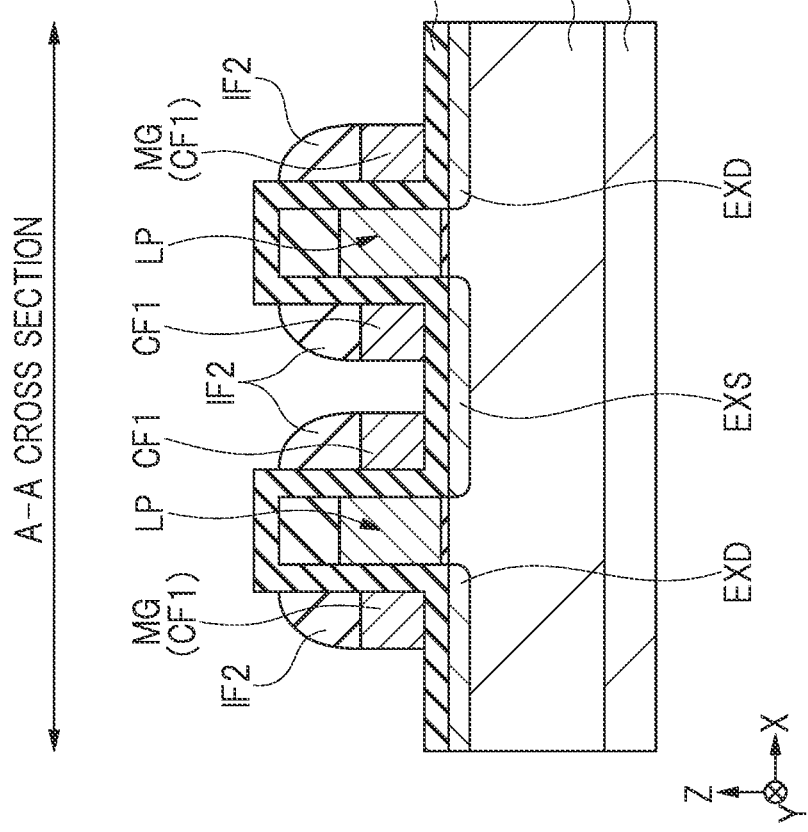
FIG. 9

FIG. 12
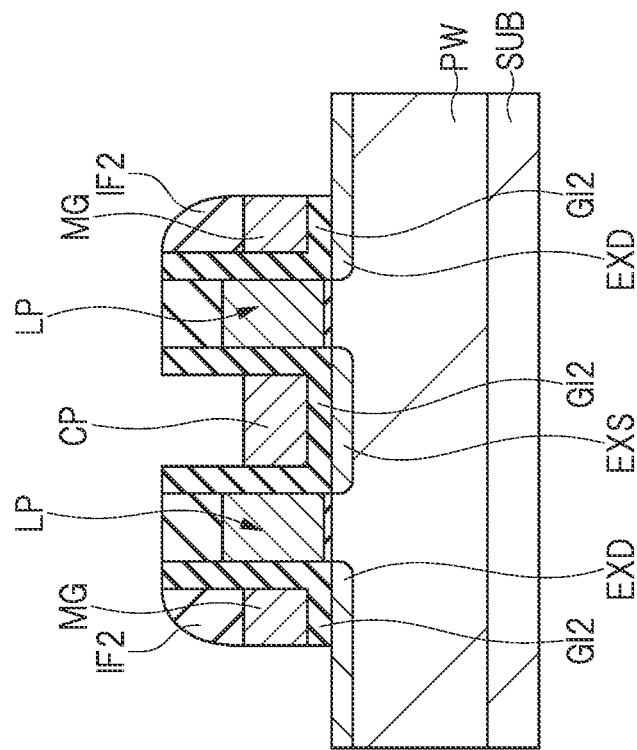
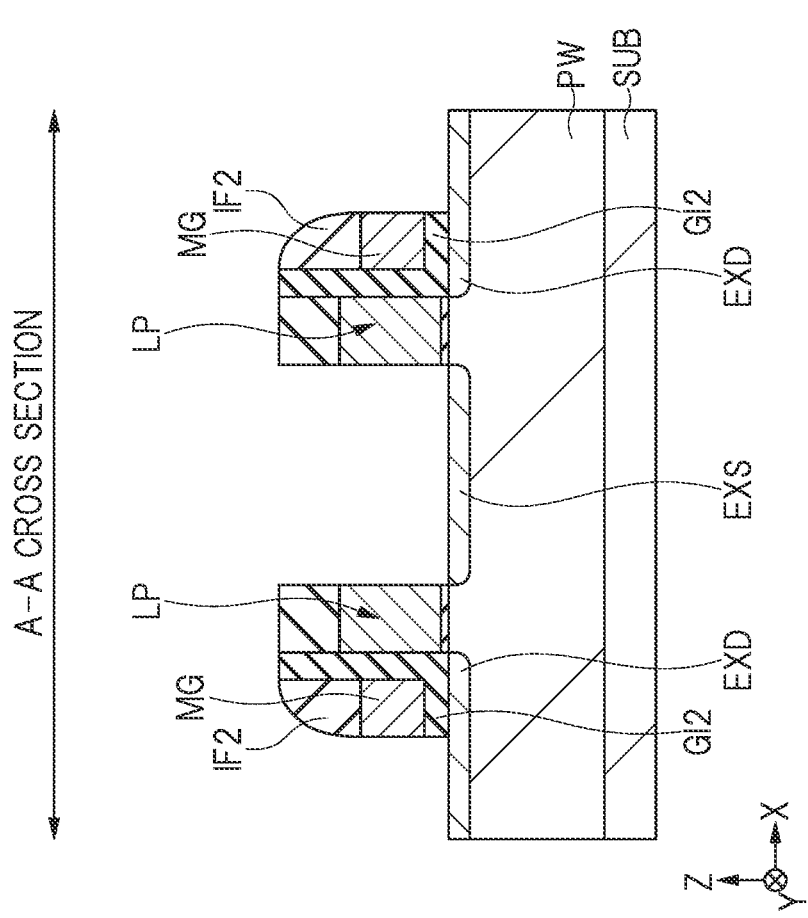

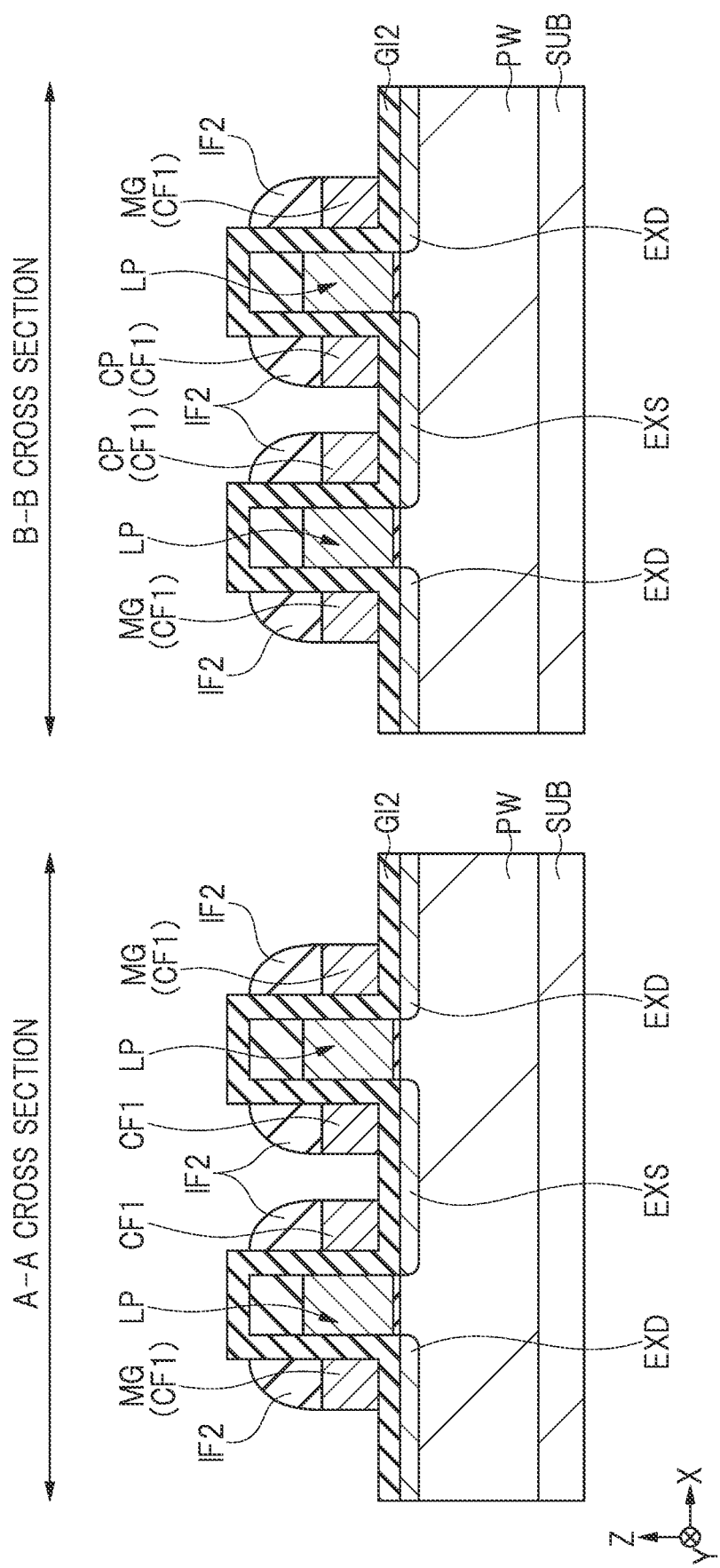

METHOD OF DETERMINING THICKNESS OF MEMORY GATE ELECTRODE DURING DEVICE MANUFACTURE

CROSS-REFERENCE TO RELATED APPLICATION

The disclosure of Japanese Patent Application No. 2020-157052 filed on Sep. 18, 2020, including the specification, drawings and abstract is hereby incorporated by reference in its entirety.

BACKGROUND

The present invention relates to a semiconductor device and a method of manufacturing the semiconductor device, and particularly relates to a semiconductor device including a split-gate memory cell.

There are disclosed techniques listed below.
[Patent Document 1] Japanese Unexamined Patent Application Publication No. 2014-154665.

As a non-volatile memory cell capable of electrically programming and erasing, flash memory or EEPROM (electrically erasable and programmable read only memory) has been widely used. Such a non-volatile memory cell includes a charge accumulating layer such as a conductive floating-gate electrode or a trap insulating film. In addition, a split-gate memory cell including a memory transistor in which a charge accumulating layer is formed as a part of a gate insulating film and a control transistor provided at a position next to the memory transistor has been known.

For example, Patent Document 1 discloses a technique of forming a gate insulating film and a control gate electrode of a control transistor, depositing a conductive film like a polycrystalline silicon to be a memory gate electrode of a memory transistor, polishing the deposited conductive film by a CMP (chemical mechanical polishing), and performing an anisotropic etching to the polished conductive film, thereby setting back the conductive film.

SUMMARY

The technique Patent Document 1 discloses formation of a memory gate electrode by further performing an anisotropic etching the conductive film. Here, there is a problem of residue occurring after the anisotropic etching when a thickness of the set back conductive film is too large, and there is another problem of etching damage of a surface of a semiconductor substrate when the thickness of the set back conductive film is too small. These problems causes a lowering of reliability of the semiconductor device.

In addition, since there is a position reliability in the anisotropic etching, there is a problem of thickness variation of the set back conductive film at a center portion of the non-volatile memory cell array and an edge portion of the non-volatile memory cell array.

Conventionally, as a technique of measuring a thickness of a set back conductive film, there has been an OCD (optical critical dimension) measurement and a method of confirming a thickness by cleaving a cross section.

The OCD measurement cannot monitor a position reliability of a thickness of a conductive film at a center portion of the non-volatile memory cell array and an edge portion of the non-volatile memory cell array while it is capable of in-line measurement. On the other hand, in the cross-section confirmation, it is necessary to retrieve a part of a semiconductor substrate as a semiconductor piece to test the semiconductor piece. Thus, it takes a tremendous time to confirm a thickness of the conductive film and feed back a result of the confirmation.

Thus, it is desired to develop a technique capable of improving reliability of a semiconductor device by monitoring thicknesses of a conductive film at a center portion of a non-volatile memory cell array and an edge portion of the non-volatile memory cell array without destruction of the semiconductor substrate. Other problems and novel characteristics will be apparent from the description of the present specification and the attached drawings.

According to an embodiment, a method of manufacturing a semiconductor device uses a semiconductor substrate having a product region for forming a semiconductor element and a scribe region surrounding the product region. Also, the method of manufacturing a semiconductor device includes the steps of: (a) forming, in the product region and the scribe region, a first gate insulating film on the semiconductor substrate and forming a first gate electrode extended in a first direction in a plan view on the first gate insulating film, thereby forming a stacked-layer body including the first gate insulating film and the first gate electrode; (b) after the step (a), forming a second gate insulating film on the semiconductor substrate in the product region and the scribe region so as to cover the stacked—layer body; (c) after the step (b), forming a first conductive film on the second gate insulating film in the product region and the scribe region so as to cover the stacked-layer body via the second gate insulating film; (d) after the step (c), performing an etching process to the first conductive film in the product region and the scribe region so as to make a position of an upper surface of the first conductive film lower than that of an upper layer of the stacked-layer body, thereby forming a first measurement pattern that is formed of the first conductive film in the scribe region and extended in the first direction; (e) after the step (d), forming a second gate electrode that is formed of the first conductive film in the product region and extended in the first direction by patterning the first conductive film in the product region; (f) after the step (e), forming a first insulating film so as to cover at least an upper surface of the second gate electrode in the product region and an upper surface of the first measurement pattern in the scribe region; (g) after the step (f), patterning the first insulating film so as to expose the upper surface of the second gate electrode in the product region and to cover the upper surface of the first measurement pattern; (h) after the step (g), forming a silicide layer on the upper surface of the second gate electrode in the product region in a state where the upper surface of the first measurement pattern is covered by the first insulating film; and (i) after the step (h), measuring a resistance value in the first direction of the first measurement pattern that is covered by the first insulating film.

In addition, according to an embodiment, a semiconductor device includes: a first gate insulating film formed on a semiconductor substrate; a first gate electrode formed on the first gate insulating film and extended in a first direction in a plan view; a first stacked-layer body and a second stacked-layer body each including the first gate insulating film and the first gate electrode and formed to be next to each other in a second direction that is crossing the first direction in a plan view; a second insulating film formed on a side surface of the first stacked-layer body, on a side surface of the second stacked-layer body, and on the semiconductor substrate positioned between the first stacked-layer body and the second stacked-layer body; a first measurement pattern formed of a first conductive film, formed between the first stacked-layer body and the second stacked-layer body via the second gate insulating film, and extended in the first direction; and a first insulating film formed on the first measurement pattern to prevent silicidation. Here, a position of an upper surface of the first measurement pattern is lower than that of an upper surface of the first stacked-layer body and that of an upper surface of the second stacked-layer body, and a resistance value in the first direction of the first measurement pattern covered by the first insulating film is measurable.

According to an embodiment, it is possible to improve reliability of a semiconductor device.

BRIEF DESCRIPTIONS OF THE DRAWINGS

FIG. 3 is a cross-sectional view illustrating a method of manufacturing a semiconductor device according to the first embodiment.

FIG. 9 is a cross-sectional view illustrating a manufacturing step of the semiconductor device continued from FIG. 8.

FIG. 12 is a cross-sectional view illustrating a manufacturing step of the semiconductor device continued from FIG. 11.

FIG. 26 is a cross-sectional view illustrating a manufacturing step of a semiconductor device according to the fourth embodiment.

SUMMARY

Figure 1:
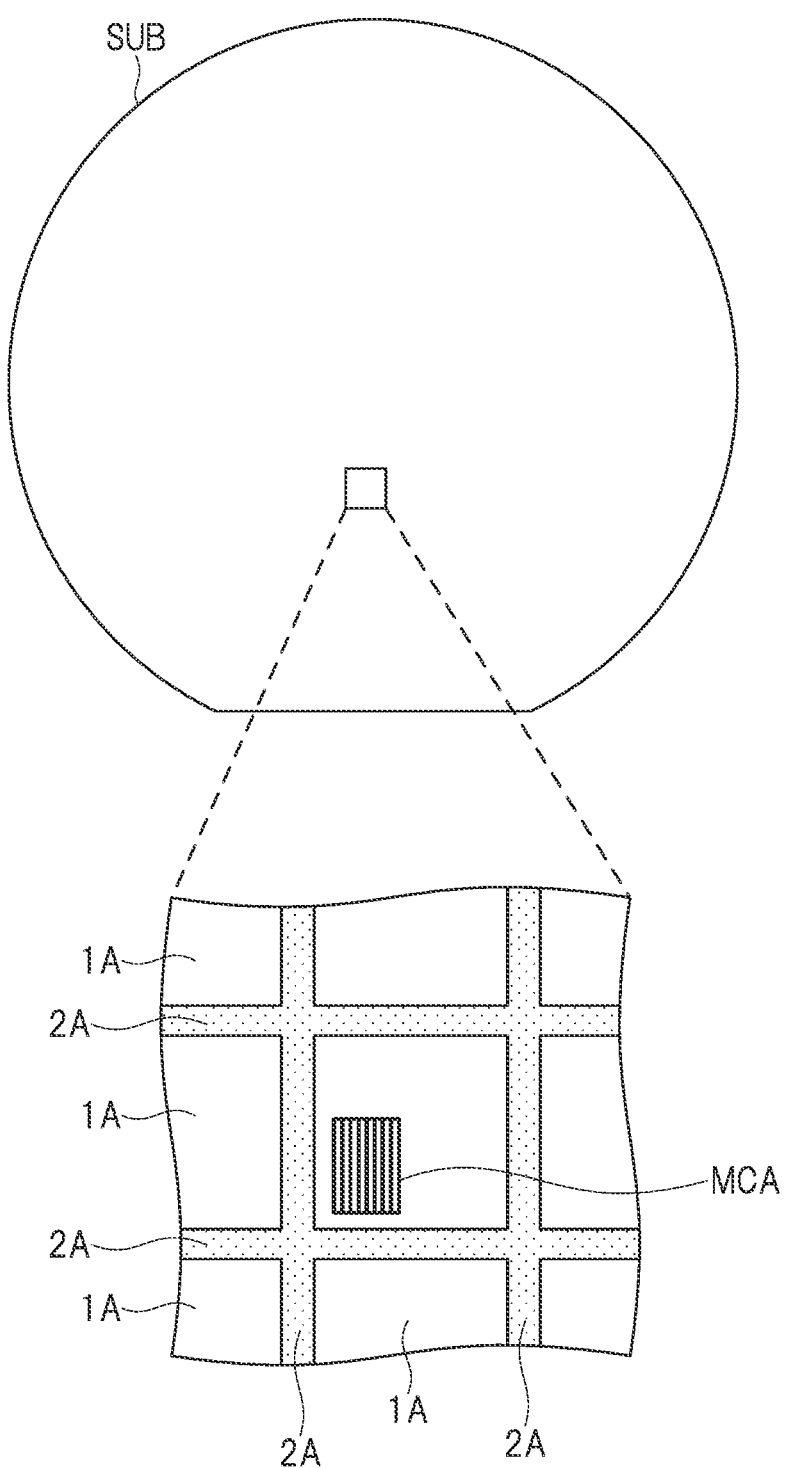
FIG. 1 is plan view illustrating a semiconductor substrate according to a first embodiment.

Hereinafter, embodiments will be described with reference to the drawings. Note that the same components are denoted by the same reference symbols throughout the drawings for describing the embodiments, and a repetitive description thereof is omitted. In addition, in the following embodiments, descriptions of the same or similar parts will not be repeated in principle unless particularly needed.

Further, in the drawings used in the present application, to facilitate viewing of the drawings, hatching may be omitted even in a cross-sectional view and hatching may be added even in a plan view.

Moreover, an X direction, a Y direction, and a Z direction described in the present application are crossing each other and orthogonal to each other. In the present application, the Z direction may be described as a vertical direction of a structure body, a height direction, or a thickness direction. In addition, an expression of "plan view" used in the present application means viewing a plane composed of the X direction and the Y direction from the Z direction.

First Embodiment

Hereinafter, with reference to FIGS. 1 to 19, a semiconductor device and a method of manufacturing the same according to a first embodiment will be described. Note that, the semiconductor device according to the present application includes an embodiment including a plurality of semiconductor elements formed to a semiconductor substrate SUB prior to a dicing step, and an embodiment including a plurality of semiconductor elements formed to a semiconductor substrate SUB that has been singulated after a dicing step.

FIG. 1 illustrates a plan view of a semiconductor substrate (semiconductor wafer) SUB used in the first embodiment and an enlarged view of a part of the semiconductor substrate SUB in an enlarged manner. The semiconductor substrate SUB has a product region 1A in which a plurality of semiconductor elements and a scribe region 2A surrounding the product region 1A.

The semiconductor element is, for example, MISFET (metal insulator semiconductor field effect transistor) and the like. There, a non-volatile memory cell array MCA in which a plurality of non-volatile memory cells (memory cells MC) as a kind of MISFET are formed is formed in the product region 1A.

Figure 2:
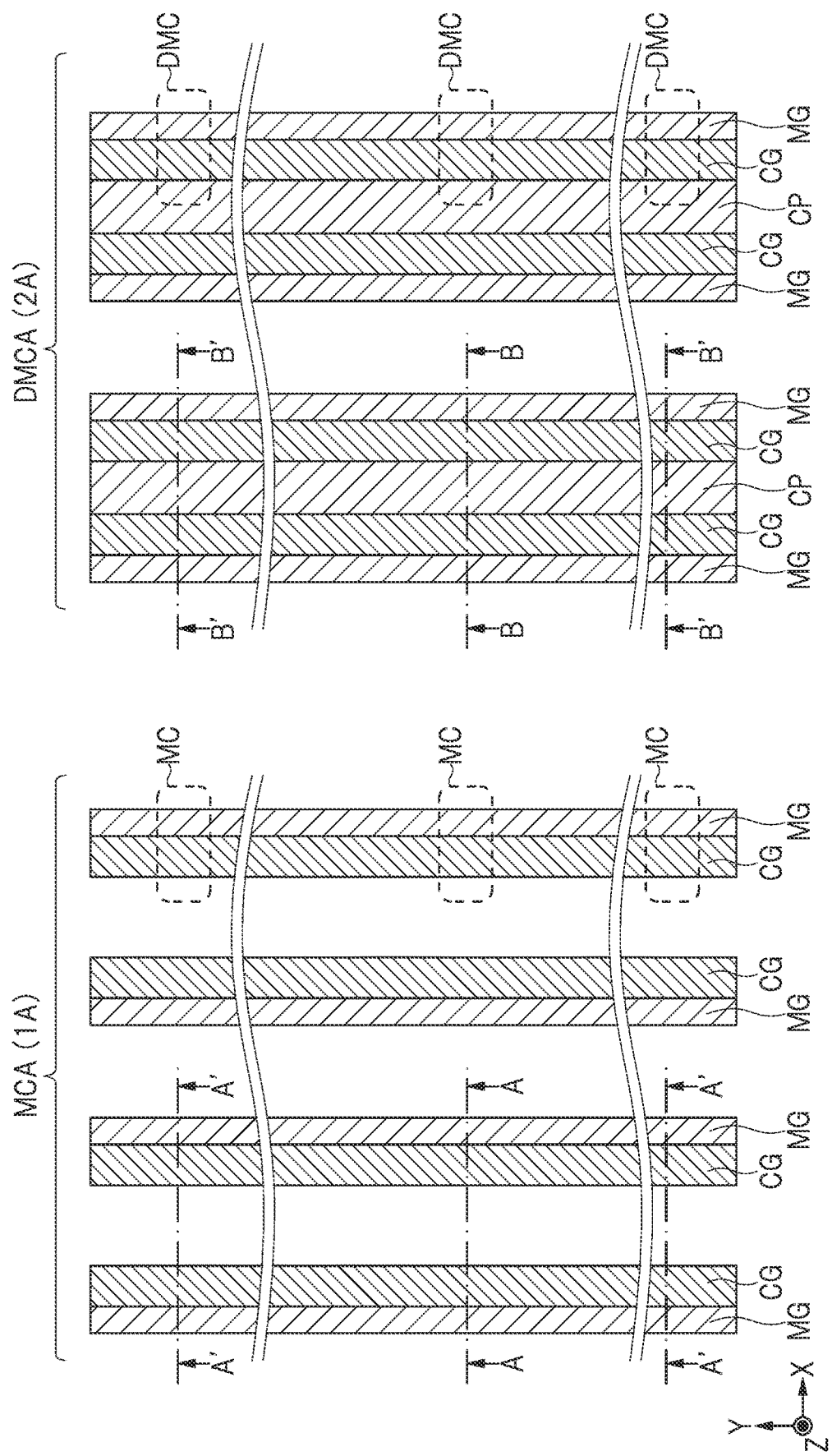
FIG. 2 is a plan view of a non-volatile memory cell array and a dummy memory cell array according to the first embodiment.

In FIG. 2, the memory cell array MCA formed in the product region 1A and a dummy memory cell array DMCA formed in the scribe region 2A are illustrated.

The non-volatile memory cell array MCA includes a plurality of memory cells MC and each of the plurality of memory cells MC includes a memory gate electrode MG and a control gate electrode CG extended in a Y direction. The dummy memory cell array DMCA includes a plurality of dummy memory DMC and each of the plurality of dummy memory cells DMC includes a memory gate electrode MG, a control gate electrode CG, and a measurement pattern CP extended in the Y direction.

The dummy memory cell array DMCA according to the first embodiment is formed in an almost same manufacturing method as that of the non-volatile memory cell array MCA and mainly provided for calculating a thickness o the memory gate electrode MG. More particularly, by measuring a resistance value of the measurement pattern CP in the Y direction, a thickness of the measurement pattern CP is calculated, and thus a thickness of the memory gate electrode MG can be calculated based on the calculated thickness of the measurement pattern CP.

A main feature of the first embodiment is calculating the thickness of the memory gate electrode MG by such a measurement pattern CP.

As illustrated in FIG. 2, the line A-A is positioned near a center portion of the non-volatile memory cell array MCA, the line A'-A' is positioned near both edge portions of the non-volatile memory cell array MCA, and the line B-B is positioned near a center portion of the dummy memory cell array DMCA, and the line B'-B' is positioned near the dummy memory cell array DMCA.

In addition, the memory gate electrode MG, the control gate electrode CG, and the measurement pattern CP may be integrated or separated in the midst between the center portion and edge portion of the dummy memory cell array DMCA. In either way, a resistance value of the measurement pattern CP neat the center portion of the dummy memory cell array DMCA and a resistance value of the measurement pattern CP near the edge portion of the dummy memory cell array DMCA can be separately measured.

In FIG. 3 and the following drawings, using a cross-sectional view along the line A-A and the line B-B, the method of manufacturing a semiconductor device according to the first embodiment will be described. Note that, since a cross-sectional view along the line A'-A' and the line B'-B' is almost the same as the cross-sectional view along the line A-A and the line B-B without a slight difference in thickness among respective stacked-layer bodies, the cross-sectional views along the line A-A and the line B-B will be described on behalf of the drawings.

First, as illustrated in FIG. 3, a semiconductor substrate SUB is prepared. The semiconductor substrate SUB is preferably formed of monocrystalline silicon having a specific resistance of about 1 Ω to 10 Ω and formed of, for example, p-type monocrystalline silicon. Next, by using a photolithography technique and an ion injection, an impurity such as boron (B) or boron difluoride ($BF_2$) is introduced to form a p-type well region PW to the semiconductor substrate SUB in the product region 1A and the scribe region 2A.

Next, in the product region 1A and the scribe region 2A, by a thermal oxidation for example, a gate insulating film GI1 formed of, for example, silicon oxide is formed on the semiconductor substrate SUB. A thickness of the gate insulating film GI1 is about 4 to 8 nm. Next, by using a CVD method for example, a conductive film formed of, for example, n-type polycrystalline silicon formed on the gate insulating film GI1. A thickness of the conductive film is about 100 to 200 nm. Next, by using a CVD method for example, an insulating film IF1 formed of, for example, silicon nitride is formed on the conductive film. A thickness of the insulating film IF1 is about 50 to 80 nm.

Next, by a photolithography technique and an anisotropic etching process, the insulating film IF1, the conductive film and the gate insulating film GI1 are selectively patterned. The patterned conductive film becomes a control gate electrode CG, and the patterned insulating film IF1 functions as a cap film. Note that, the control gate electrode CG and the insulating film IF1 are extended in the Y direction as illustrated in FIG. 2.

In this manner, a stacked-layer body LP including the insulating film IF1, the control gate electrode CG, and the gate insulating film GI1 is formed. In the product region 1A and the scribe region 2A, a plurality of stacked-layer bodies LP extended in the Y direction are formed and they are next to each other in the X direction. The plurality of stacked-layer bodies LP has a same structure, respectively.

In addition, in the first embodiment, a space between the plurality of stacked-layer bodies LP next to each other in the scribe region 2A is smaller than that of the plurality of stacked-layer bodies LP in the product region 1A. However, as described in a second embodiment described above, there may be a case in which a space between a plurality of stacked-layer bodies LP in the scribe region 2A is larger than that of a plurality of stacked-layer bodies LP in the product region 1A.

Note that, in the drawings used in the following description, to facilitate viewing of the drawings, symbols of the insulating film IF1, the control gate electrode CG, and the gate insulating film GI1 are omitted and these elements are illustrated as a stacked-layer body LP.

Next using a photolithography technique and an ion injection, an impurity such as arsenic (As) or phosphorus (P) is introduced to a well region PW, so that n-type extension regions (impurity regions) EXD and EXS are formed in the well region PW in the product region 1A and the scribe region 2A. The extension region EXD forms a part of a drain region of the memory cell MC and the dummy memory cell DMC and the extension region EXS forms a part of a source region of the memory cell MC and the dummy memory cell DMC.

Note that the extension region EXD and the extension region EXS may be formed in the same step while they may be formed separately in different steps so as to make them optimized for characteristics required for the drain region and the source region.

Figure 4:
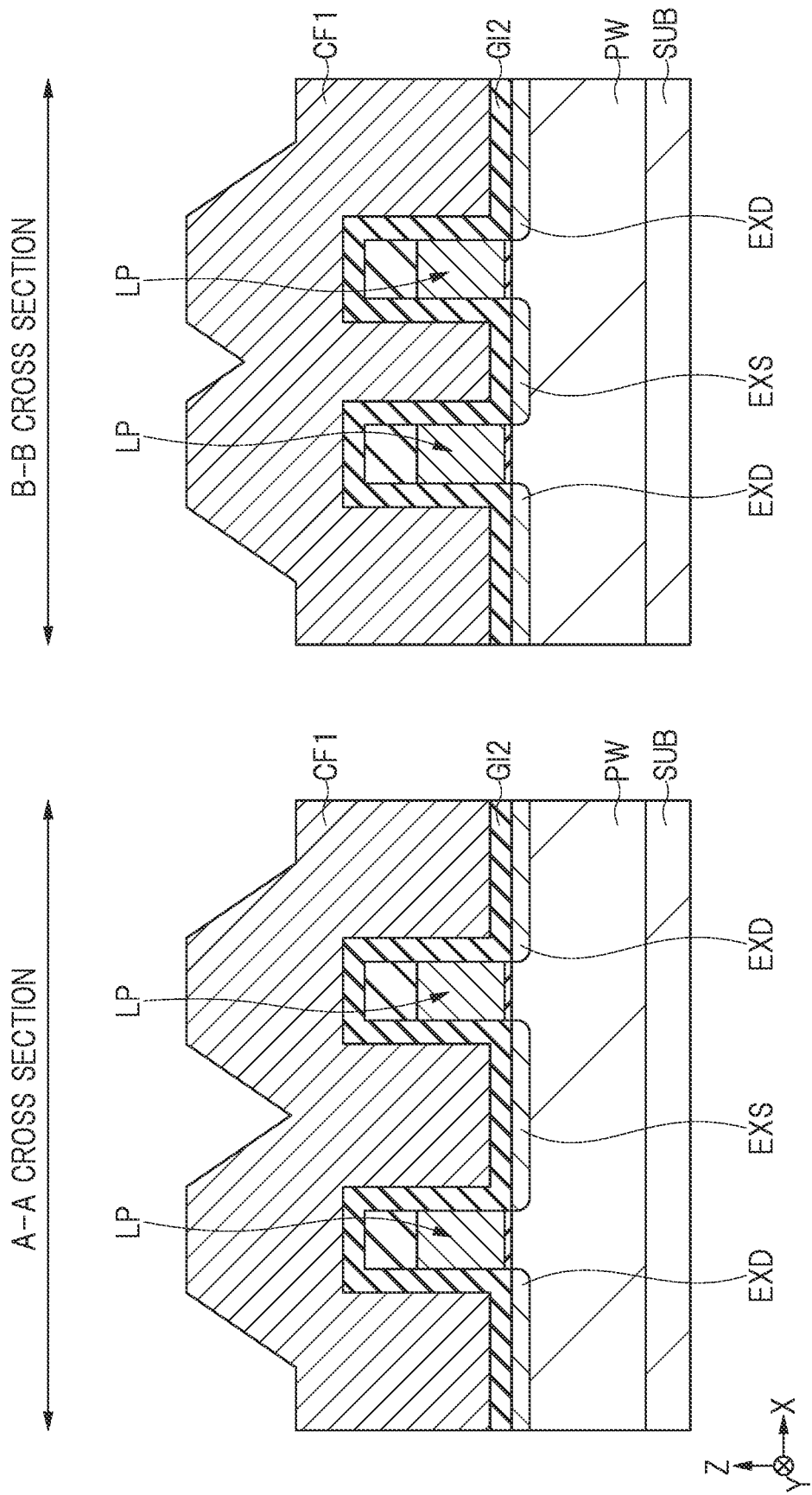
FIG. 4 is a cross-sectional view illustrating a manufacturing step of the semiconductor device continued from FIG. 3.

FIG. 4 illustrates a step of forming a gate insulating film IG2 and a conductive film CF1.

First, as illustrated in FIG. 4, the gate insulating film GI2 is formed on the semiconductor substrate SUB in the product region 1A and the scribe region 2A so as to cover the stacked-layer body LP. The gate insulating film GI2 is formed of a stacked layer film including, for example, a first silicon oxide film, a silicon nitride film, and a second silicon oxide film. This stacked layer film can be formed by sequentially depositing a first silicon oxide film, a silicon nitride film, and a second silicon oxide film by, for example, CVD method or ALD method.

In addition, a thickness of the gate insulating film GI2 is about 10 to 20 nm. A thickness of the first silicon oxide film is about 2 to 4 nm, a thickness of the silicon nitride film is about 5 to 10 nm, and a thickness of the second silicon oxide film is about 3 to 6 nm. Further, the silicon nitride film functions as a charge accumulating layer capable of accumulating electrons or holes.

Next, the conductive film CF1 is formed on the gate insulating film GI2 by, for example, CVD method in the product region 1A and the scribe region 2A so as to cover the stacked-layer body LP via the gate insulating film GI2. The insulating film CF1 is formed of, for example, n-type polycrystalline silicon. In addition, a thickness of the conductive film CF1 at this moment is about 300 to 400 nm that is larger than that of the stacked-layer body LP.

Figure 5:
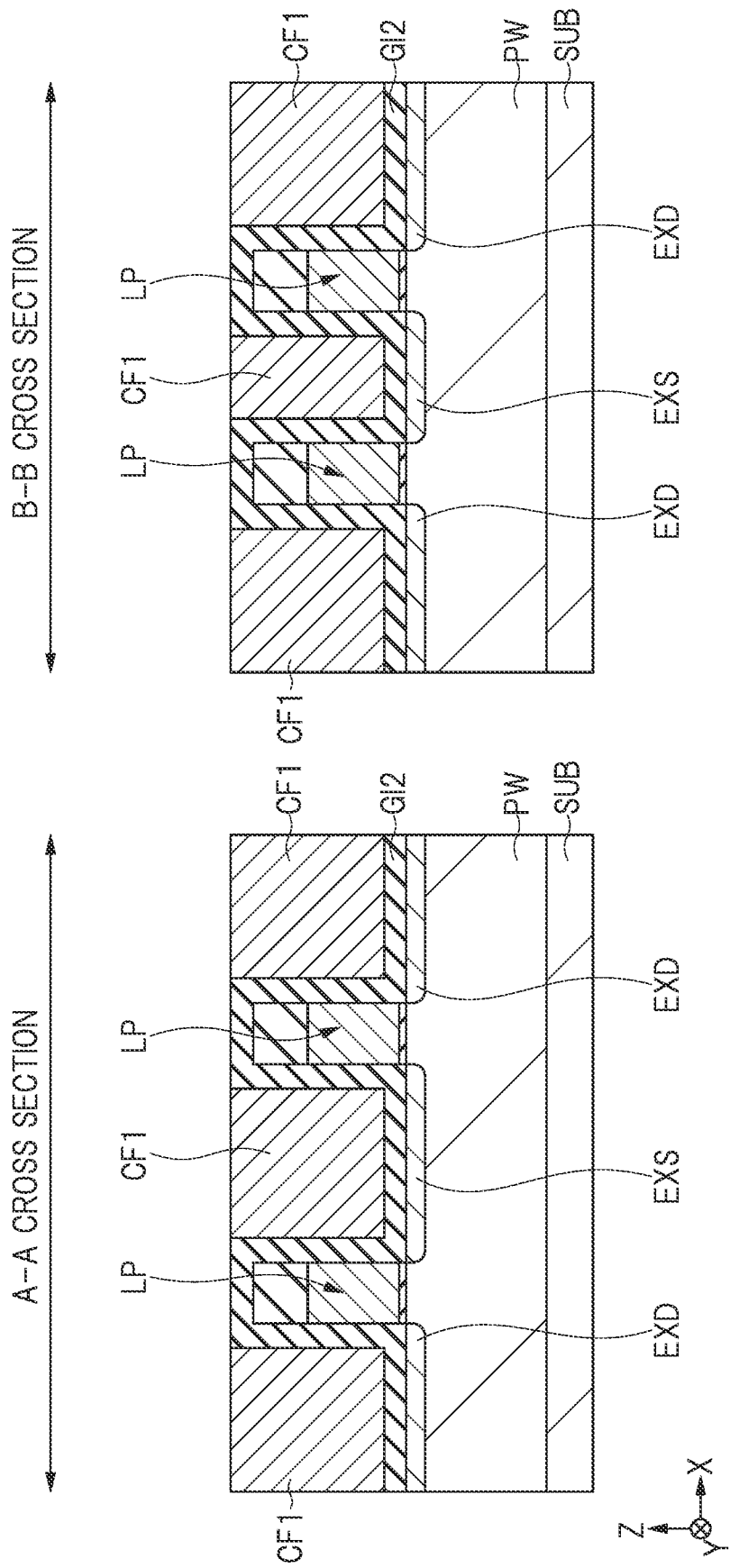
FIG. 5 is a cross-sectional view illustrating a manufacturing step of the semiconductor device continued from FIG. 4.
Figure 6:
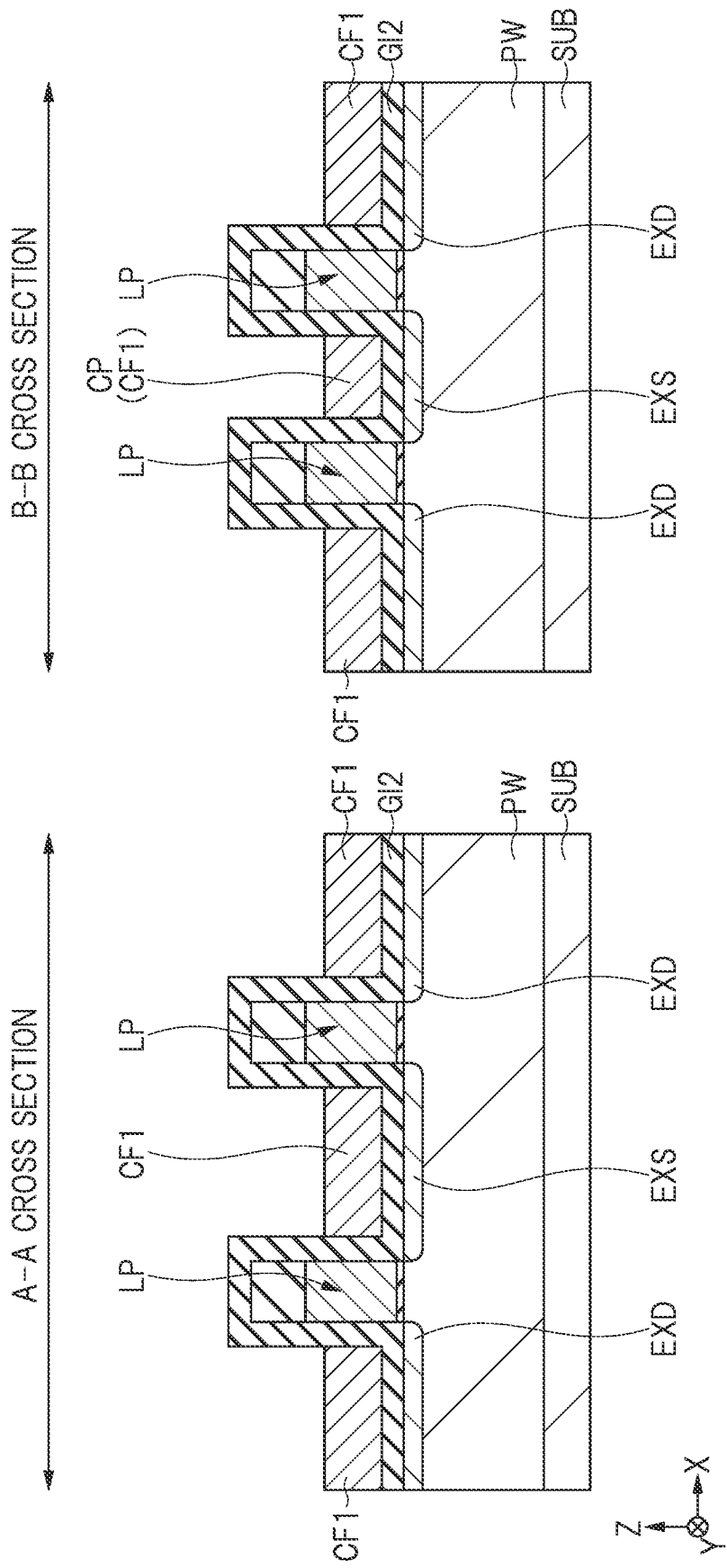
FIG. 6 is a cross-sectional view illustrating a manufacturing step of the semiconductor device continued from FIG. 5.

FIGS. 5 and 6 illustrate an etching process to the conductive film CF1. This etching process includes a polishing process and an anisotropic etching described below.

First, as illustrated in FIG. 5, to remove the conductive film CF1 on an upper surface of the stacked-layer body LP, a polishing process is performed to the conductive film CF1 in, for example, a CMP method. By this polishing process, an upper surface of the conductive film CF is planarized and the gate insulating film GI2 on the upper surface of the stacked-layer body LP is exposed.

Next, as illustrated in FIG. 6, an anisotropic etching is performed to the conductive film CF1 so that a position of the upper surface of the conductive film CF1 is lower than that of the upper surface of the stacked-layer body LP. Here, the position of the upper surface of the conductive film CF1 is lower than that of an upper surface of the control gate electrode CG.

by such an etching process, a measurement pattern CP formed of the conductive film CF and extended in the Y direction is formed between the two stacked-layer bodies LP in the scribe region 2A.

Figure 7:
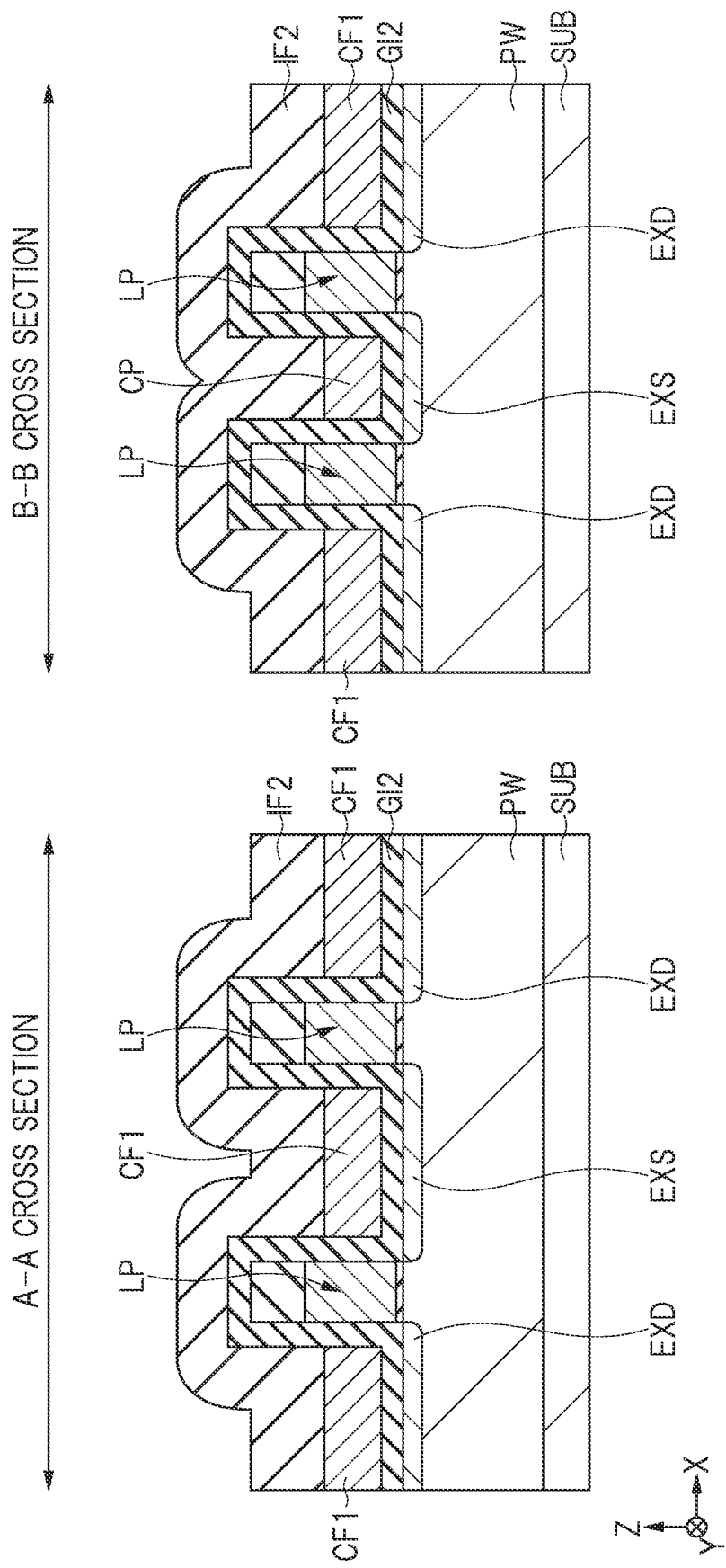
FIG. 7 is a cross-sectional view illustrating a manufacturing step of the semiconductor device continued from FIG. 6.
Figure 8:
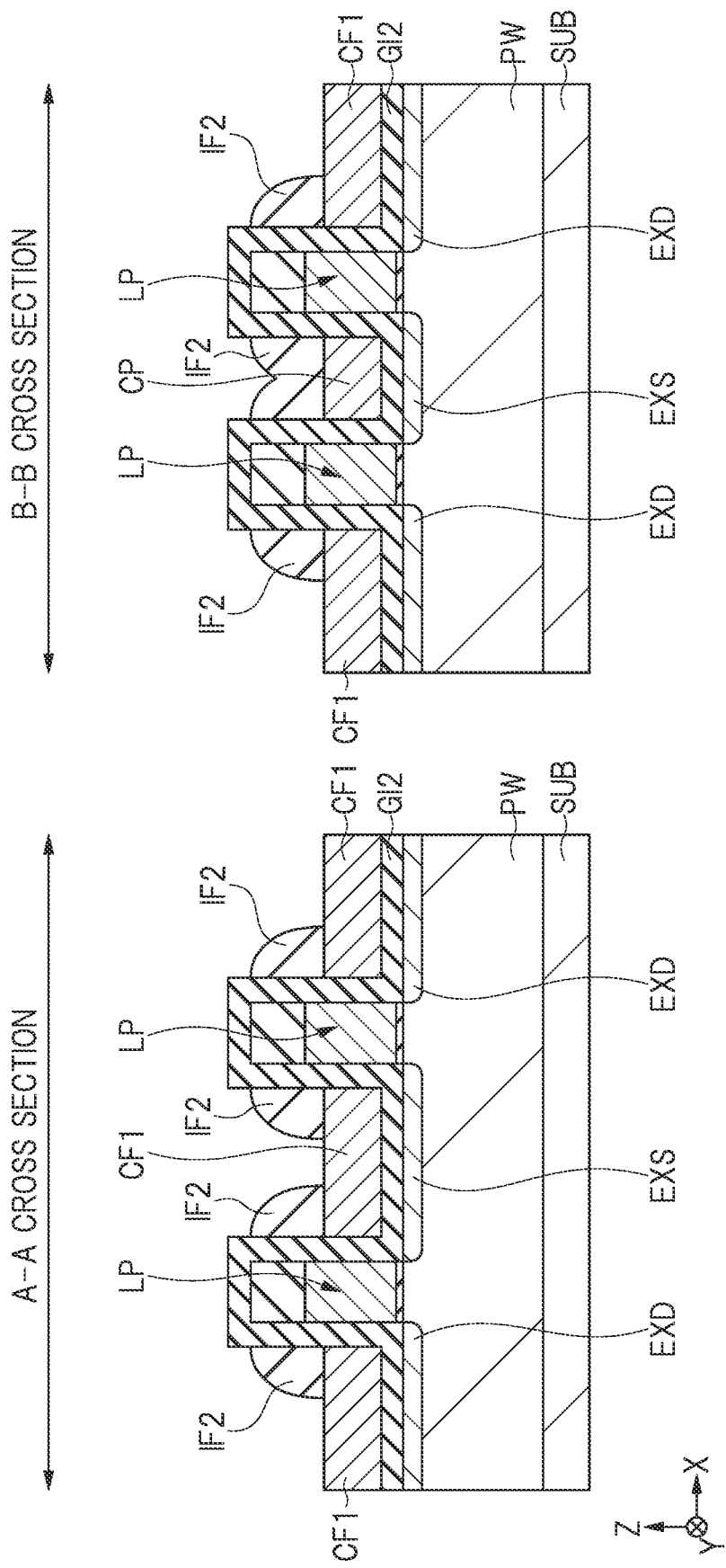
FIG. 8 is a cross-sectional view illustrating a manufacturing step of the semiconductor device continued from FIG. 7.

FIGS. 7 to 9 illustrate a process of forming a memory gate electrode MG by patterning the conductive film CF1.

First, as illustrated in FIG. 7, an insulating film IF2 is formed on the conductive film CF1 by, for example, CVD method in the product region 1A and the scribe region 2A so as to cover the stacked-layer body LP protruded from the upper surface of the conductive film CF1. The insulating film IF2 is formed of, for example, silicon oxide. In addition, a thickness of the insulating film IF2 at this moment is about 100 to 150 nm.

Next, as illustrated in FIG. 8, by performing an anisotropic etching to the insulating film IF2 in the product region 1A and the scribe region 2A, the insulating film IF2 in a shape of sidewall spacer is left on a side surface of the stacked-layer body LP and on the upper surface of the in the product region 1A and on a side surface of the stacked-layer body LP and on an upper surface of the measurement pattern CP in the scribe region 2A.

Note that, in the first embodiment, since a space between a couple of the stacked-layer body LP is small, the upper surface of the measurement pattern CP in the scribe region 2A is not exposed because it is covered by the insulating film IF2.

Next, as illustrated in FIG. 9, by performing an anisotropic etching using the insulating film IF2 as a mask in a state where the measurement pattern CP in the scribe region 2A is covered by the insulating film IF2, the conductive film CF1 in the product region 1A and the scribe region 2A is selectively patterned. By this anisotropic etching, a memory gate electrode MG formed of the conductive film CF1 and extended in the Y direction is formed.

Figure 10:
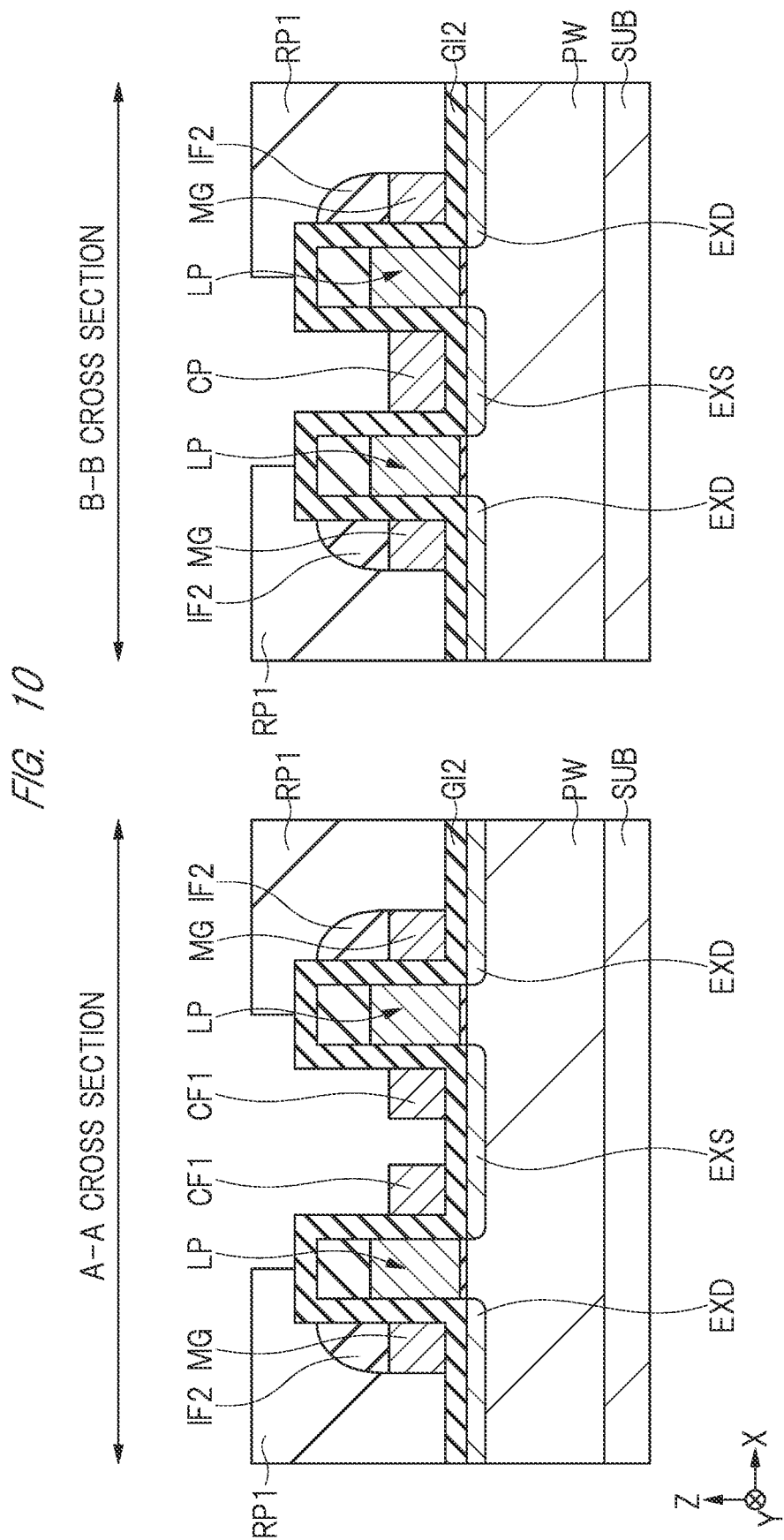
FIG. 10 is a cross-sectional view illustrating a manufacturing step of the semiconductor device continued from FIG. 9.
Figure 11:
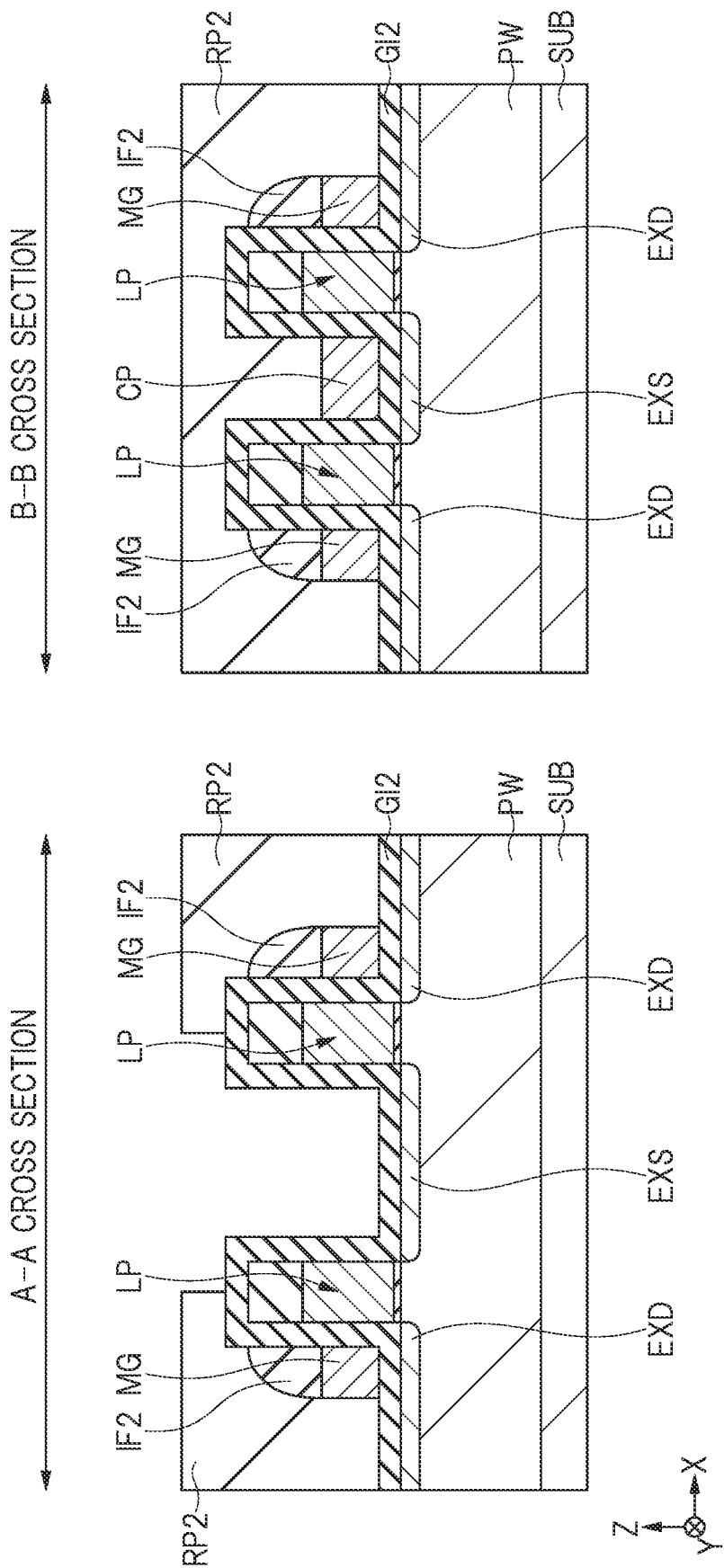
FIG. 11 is a cross-sectional view illustrating a manufacturing step of the semiconductor device continued from FIG. 10.

In FIGS. 10 to 12, a process of removing unnecessary portions of the insulating film IF2, the conductive film CF1, and the gate insulating film GI2 is performed.

First, as illustrated in FIG. 10, a resist pattern RP1 having a pattern in which a portion between a pair of the stacked-layer bodies LP is opened is formed in the product region 1A and the scribe region 2A. Next, by performing a wet etching using an aqueous solution containing hydrofluoric acid and using the resist pattern RP1 as a mask, the insulating film IF2 between a pair of the stacked-layer bodies LP removed. Then, the resist pattern RP1 is removed by an ashing process and so forth.

Next, as illustrated in FIG. 11, a resist pattern RP2 having a pattern in which a portion between a pair of the stacked-layer bodies LP is opened in the product region 1A is formed, the resist pattern RP2 covering the scribe region 2A. Next, using the resist pattern RP2 as a mask, the conductive film CF1 between the pair of stacked-layer bodies LP is removed by an anisotropic etching. Then, the resist pattern RP2 is removed by an asking process and so forth.

Next, as illustrated in FIG. 12, the gate insulating film GI2 exposed from the memory gate electrode MG and the measurement pattern CP is removed. When the gate insulating film GI2 is formed of a first silicon oxide film, a silicon nitride film and a second silicon oxide film, the first silicon oxide film an the second silicon oxide film can be removed by a wet etching using an aqueous solution containing hydrofluoric acid and the silicon nitride film can be removed by a wet etching using an aqueous solution containing hot phosphoric acid.

Figure 13:
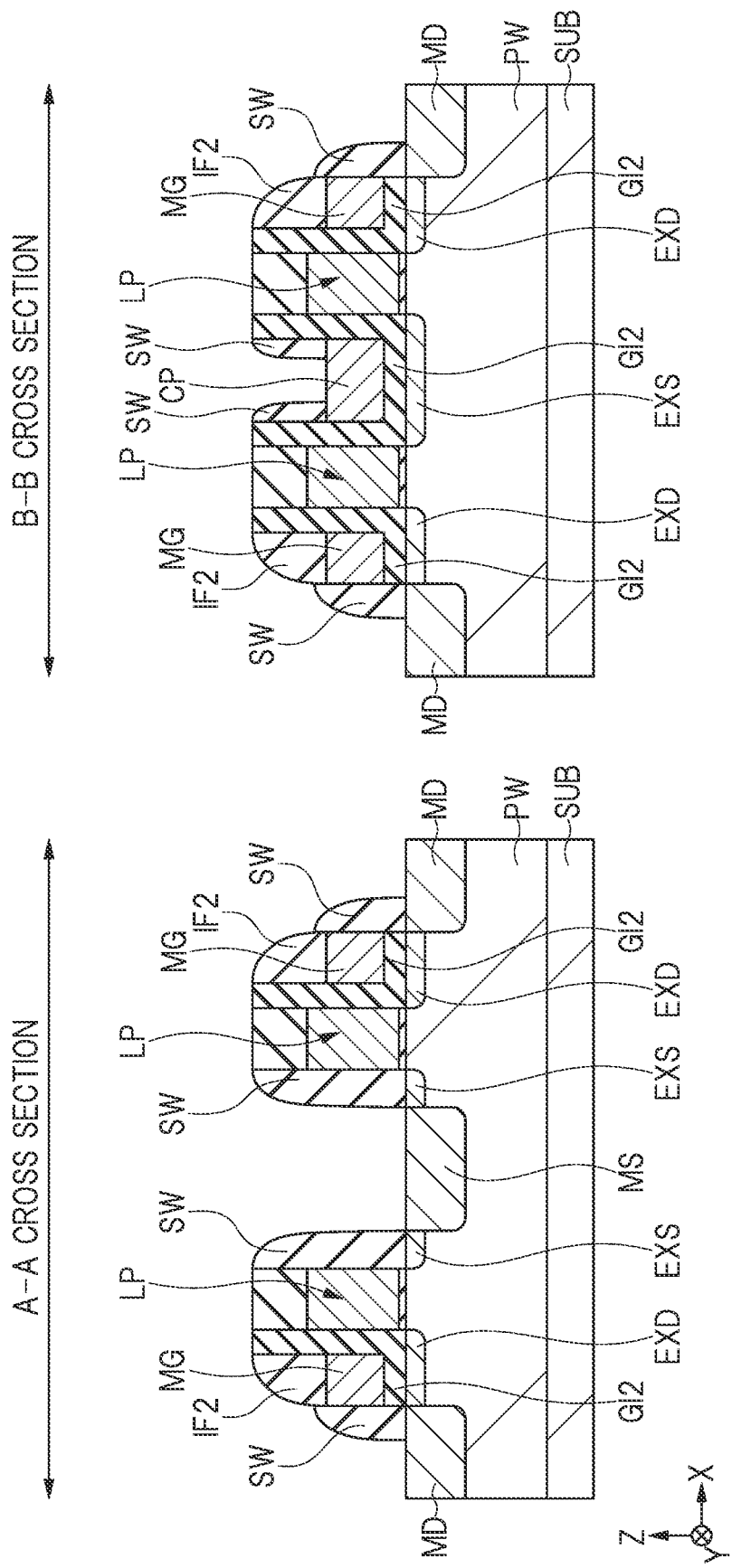
FIG. 13 is a cross-sectional view illustrating a manufacturing step of the semiconductor device continued from FIG. 12.

FIG. 13 illustrates a process of forming a sidewall spacer SW, a diffusion region MS, and a diffusion region MD.

First, in the product region 1A and the scribe region 2A, an insulating film formed of, for example, silicon nitride is formed on the semiconductor substrate SUB using, for example, a CVD method. Next, by performing a sidewall spacer SW is formed on a side surface of the control gate electrode CG and on a side surface of the memory gate electrode MG by performing an anisotropic etching to the insulating film. In addition, the sidewall spacer SW is formed also on the measurement pattern CP in the scribe region 2A.

Note that the sidewall spacer SW may be a stacked layer film of a silicon oxide film and a silicon nitride film. In other words, the sidewall spacer SW formed of a stacked layer film of these may be formed by forming a silicon oxide film and a silicon nitride film on the silicon oxide film and then performing an anisotropic etching.

Next, by introducing an impurity of arsenic (As), phosphorus (P) or the like to the well region PW using a photolithography technique and an ion injection, an n-type diffusion region (impurity region) MD is formed in the well region PW in the product region 1A and the scribe region 2A, so that an n-type diffusion region (impurity region) MS in the well region PW in the product region 1A. The diffusion region MD forms a part of a drain region of the memory cell MC and the dummy memory cell DMC and the diffusion region MS forms a part of a source region of the memory cell MC.

Note that, although the diffusion region MD and the diffusion region MS may be formed in the same step, they may be separately formed in different steps, respectively, so as to make them optimized for characteristics required for the drain region and the source region.

Figure 14:
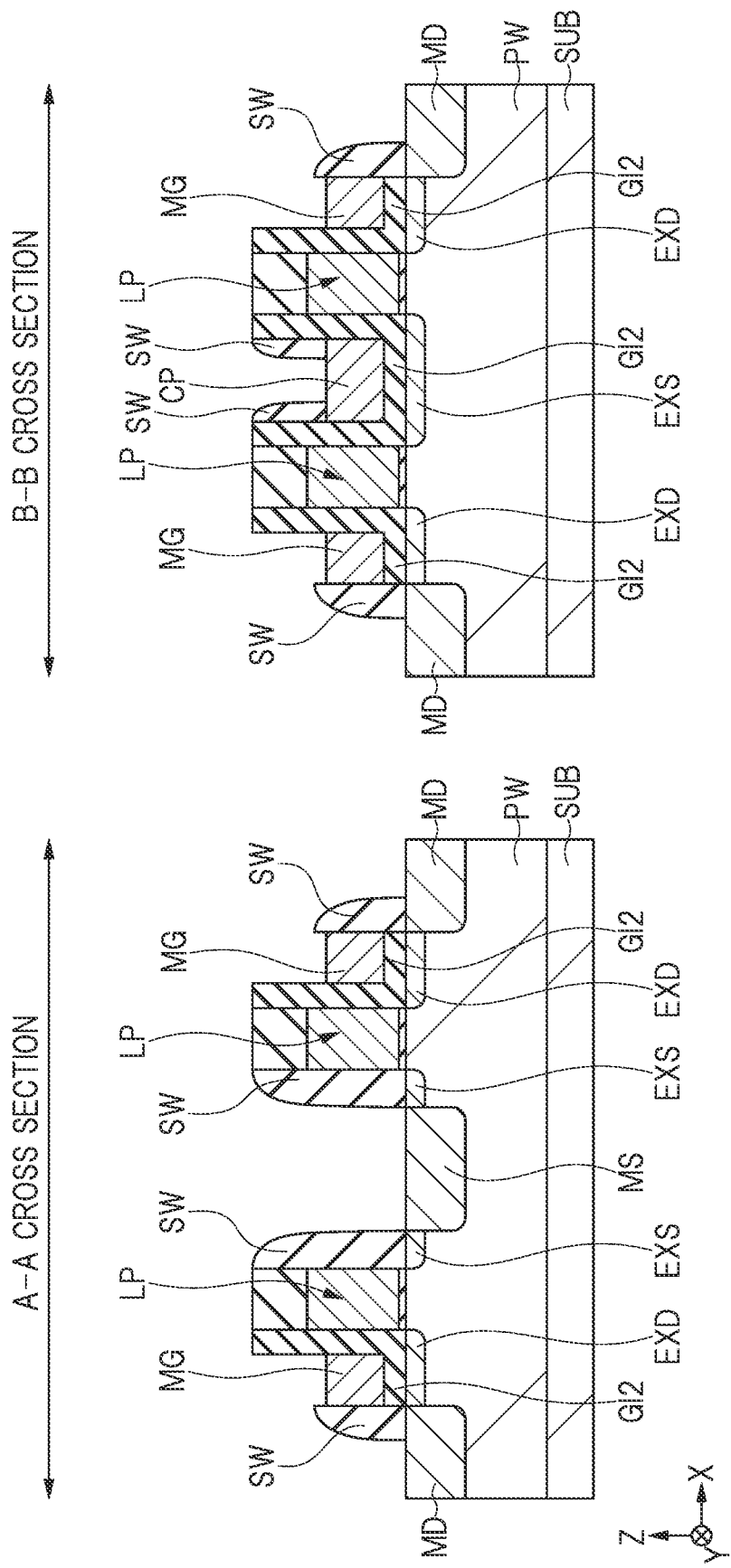
FIG. 14 is a cross-sectional view illustrating a manufacturing step of the semiconductor device continued from FIG. 13.

FIG. 14 illustrates a step of removing the insulating film IF2.

In the product region 1A and the scribe region 2A, the insulating film IF2 formed on the memory gate electrode MG is removed by performing a wet etching using an aqueous solution containing, for example, hydrofluoric acid.

Figure 15:
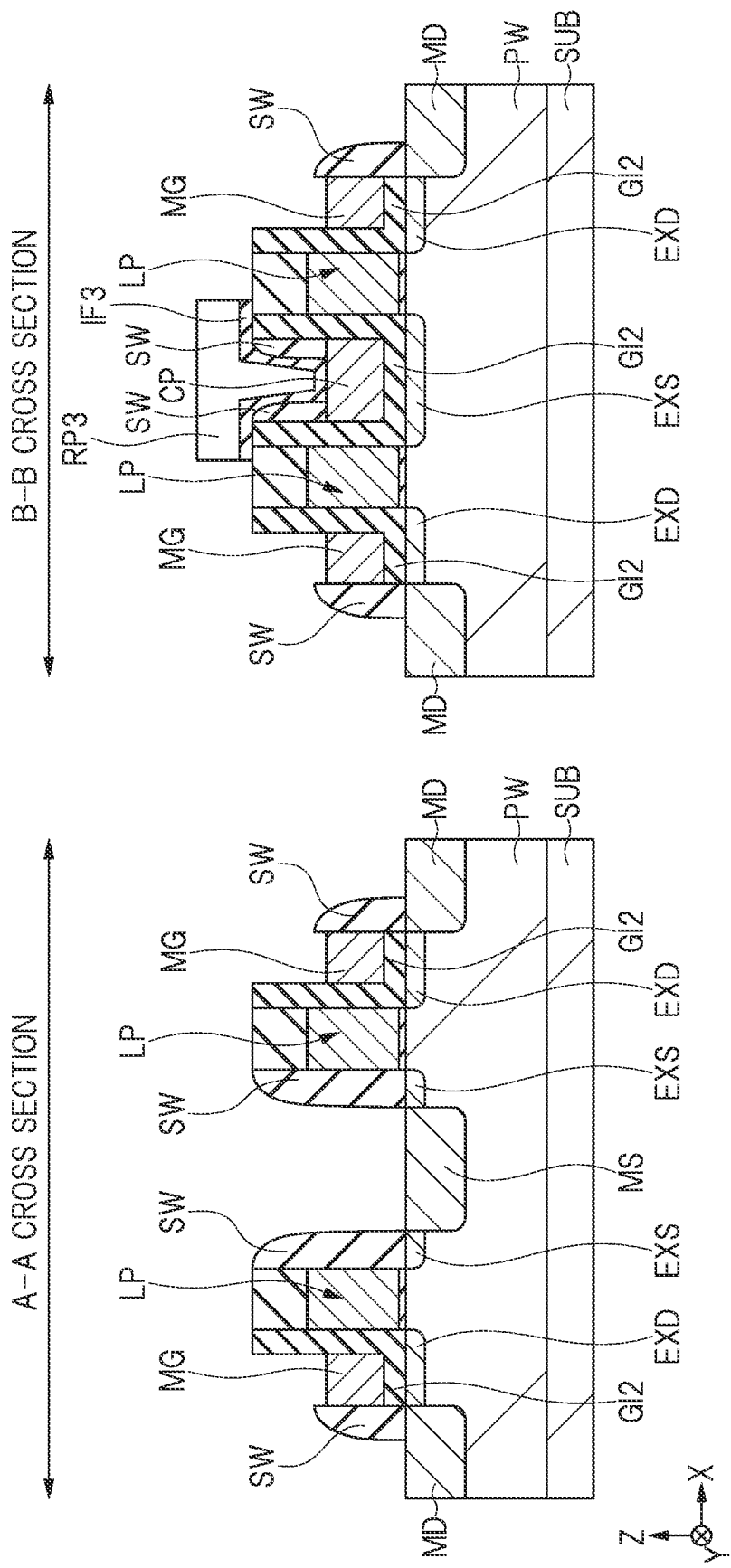
FIG. 15 is a cross-sectional view illustrating a manufacturing step of the semiconductor device continued from FIG. 14.
Figure 16:
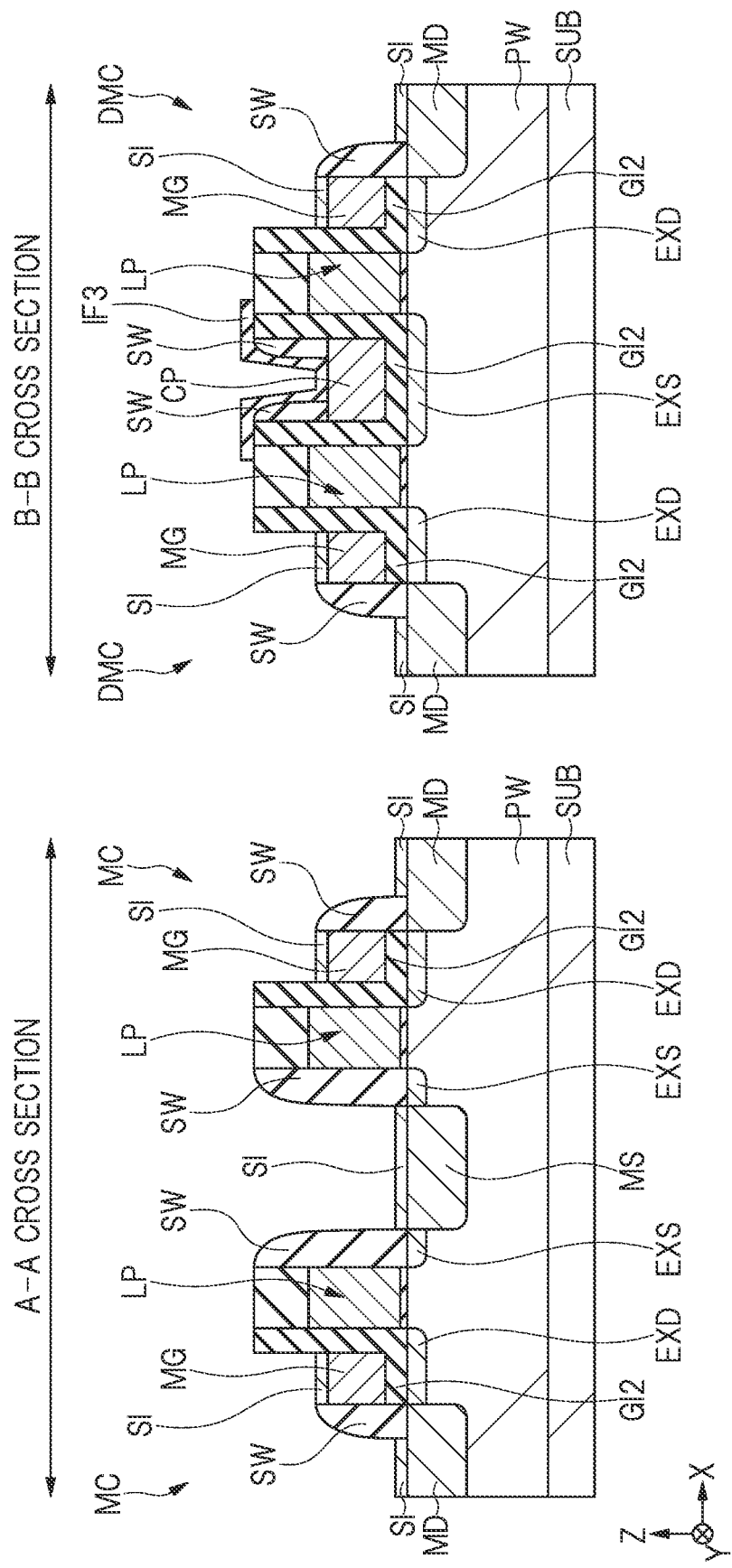
FIG. 16 is a cross-sectional view illustrating a manufacturing step of the semiconductor device continued from FIG. 15.

FIGS. 15 and 16 illustrate a process of forming an insulating film IF3 and a silicide layer SI.

First, as illustrated in FIG. 15, in the product region 1A and the scribe region 2A, the insulating film IF3 is formed all over a main surface of the semiconductor substrate SUB by, for example, CVD method. Here, the insulating film IF3 is formed of, for example, silicon oxide, and at least an upper surface of the memory gate electrode MG in the product region 1A and an upper surface of the measurement pattern CP in the scribe region 2A are covered by the insulating film IF3.

Next, a resist pattern RP3 having a pattern in which the measurement pattern CP in the scribe region 2A is covered and the other region is opened. Next, the insulating film IF3 exposed from the resist pattern RP3 is removed by performing a wet etching using an aqueous solution containing, for example, hydrofluoric acid using the resist pattern RP3 as a mask. In this manner, the insulating film IF3 is patterned. Then, the resist pattern RP3 is removed by an ashing processing or the like.

In this state, in the product region 1A and the scribe region 2A, the upper surface of the memory gate electrode MG, the diffusion region MD, and the diffusion region MS are exposed from the insulating film IF3, and the upper surface of the measurement pattern CP is covered by the insulating film IF3 in the scribe region 2A.

Next, as illustrated in FIG. 16, in a state where the upper surface of the measurement pattern CP is covered by the insulating film IF3, the silicide layer SI is formed on the upper surfaces of the memory gate electrode MG and the diffusion region MD in the product region 1A and the scribe region 2A and on the upper surface of the diffusion region MS in the scribe region 2A by a salicide (self aligned silicide) technique.

The silicide layer SI can be formed in the following manner. First, a metal film for forming the silicide layer SI is formed so as to cover the main surface of the semiconductor substrate SUB entirely. This metal film is formed of, for example, cobalt, nickel, or a nickel platinum alloy. Next, a first thermal processing at about 300° C. to 400° C. is performed on the semiconductor substrate SUB and then performing a second thermal processing at about 600° C. to 700° C. so as to make the metal film reacted with a material contained in each of the memory gate electrode MG, diffusion region MD, and diffusion region MS. In this manner, the silicide layer SI formed of cobalt silicide ($CoSi_2$), nickel silicide (NiSi) or nickel platinum silicide (NiPtSi) is formed. Then, an unreacted portion of the metal film is removed.

In the above-described manner, the memory cell MC is formed in the product region 1A and the dummy memory cell DMC is formed in the scribe region 2A. The memory cell MC in the first embodiment is a non-volatile memory which includes the control gate electrode CG, the gate insulating film GI1, the memory gate electrode MG, the gate insulating film GI2, the diffusion region MD, the extension region EXD, the diffusion region MS, and the extension region EXS. The dummy memory cell DMC is formed in the same manner as the memory cell MC except for the points that the measurement pattern CP is included and the diffusion region MS is not included.

A plug PG described layer is coupled to the control gate electrode CG, the memory gate electrode MG, the diffusion region MD and the diffusion region MS, respectively so that predetermined voltages required for a programming operation, an erasing operation and a reading operation are applied via the plug PG. As a main purpose of providing the dummy memory cell DMC is to measure a resistance value by the measurement pattern CP, the plug PG may not be coupled to the control gate electrode CG, the memory gate electrode MG, the diffusion region MD, and the diffusion region MS of the dummy memory cell DMC.

Figure 17:
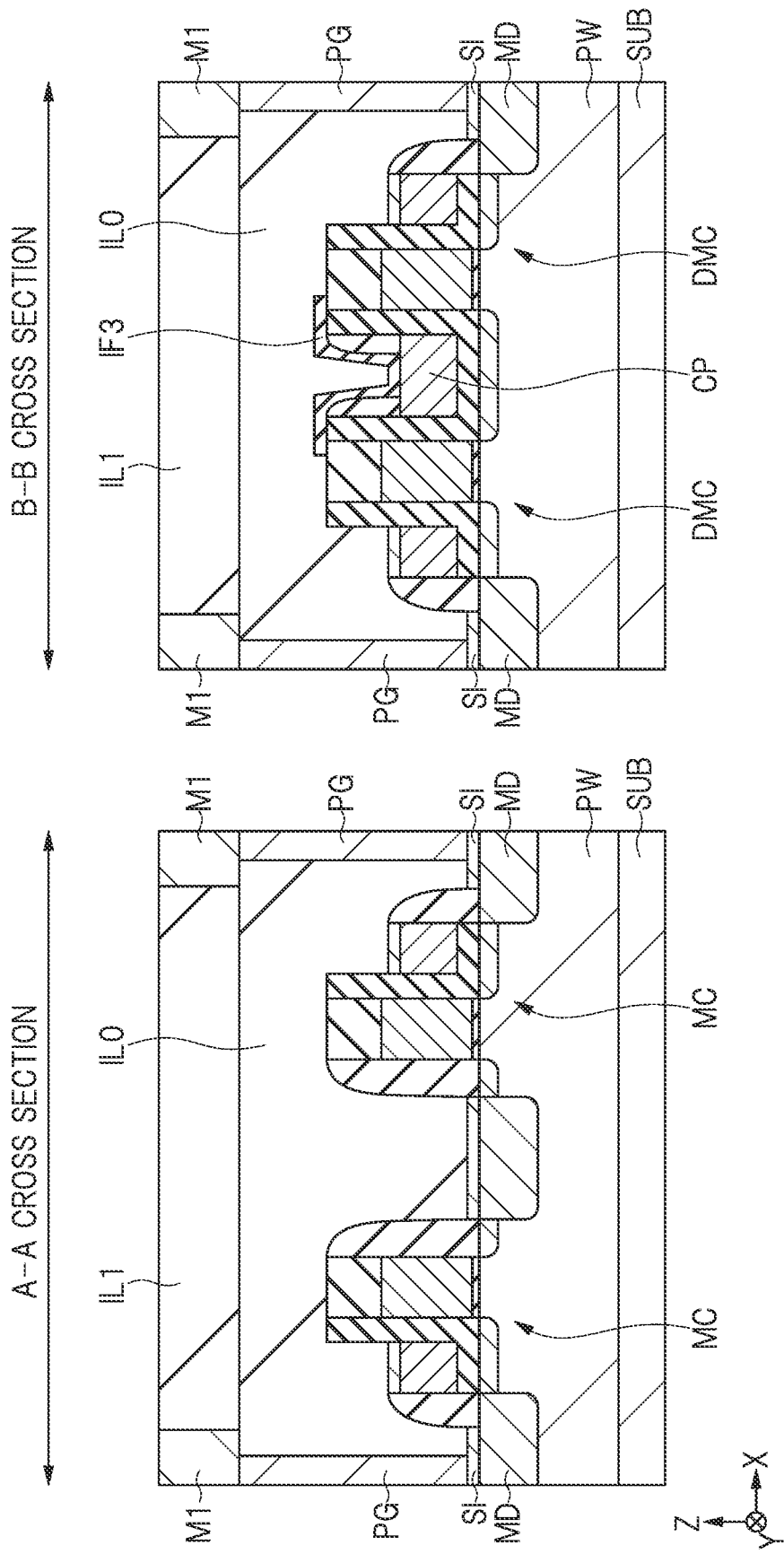
FIG. 17 is a cross-sectional view illustrating a manufacturing step of the semiconductor device continued from FIG. 16.

Then, as illustrated in FIG. 17, an inter layer insulating film IL0, a plug PG, an interlayer insulating film IL1 and a wiring M1 and so forth are formed.

First, the interlayer insulating film IL0 formed of, for example, silicon oxide is formed by, for example, CVD method in the product region 1A and the scribe region 2A so as to cover the memory cell MC and the dummy memory cell DMC. Next, interlayer insulating film IL0 is polished by using, for example, CMP method to planarize an upper surface of the interlayer insulating film IL0.

Next, a contact holy is formed in the interlayer insulating film IL0 and the plug PG is buried in the contact hole. The plug PG is formed of, for example, a titanium film, titanium nitride film, or a barrier metal film formed of a staked film of these films, and a conductive film like tungsten film.

Next, on the interlayer insulating film IL0 in which the plug is buried, the interlayer insulating film IL1 formed of, for example, SiOC is formed by, for example, CVD method. Next, after forming a groove for wiring to the interlayer insulating film IL1, a conductive film mainly containing, for example, copper is buried in the groove for wiring, so that the wiring M1 coupled to the plug PG is formed in the interlayer insulating film IL1. The structure of the wiring M1 is so-called damascene wiring structure. Next a multilayer wiring including wirings of a second and subsequent wiring layers will be formed by, for example, dual damascene method and the like, illustrations and descriptions of the multilayer wiring will be omitted here. Then, the semiconductor substrate SUB is singulated along the scribe region 2A by a dicing process and the like.

Figure 18:
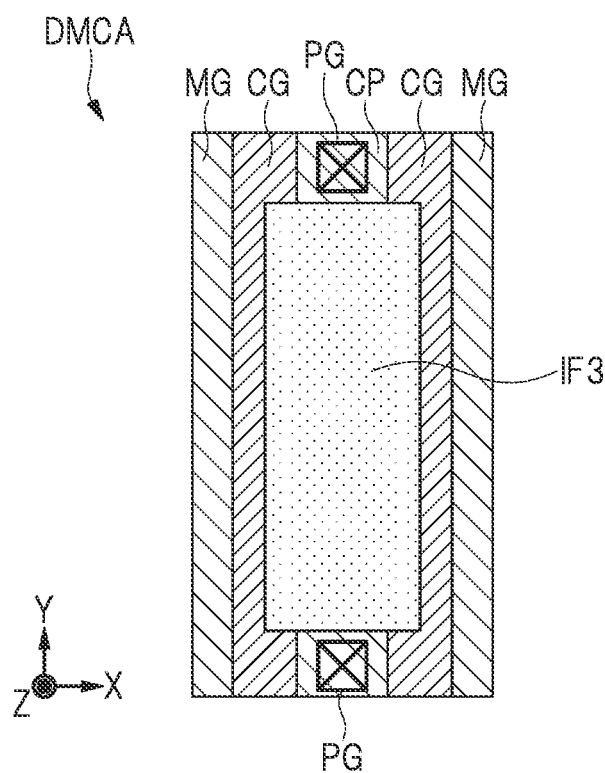
FIG. 18 is a plan view illustrating a part of the dummy memory cell array according to the first embodiment.

FIG. 18 illustrates a plan view in which a part of the dummy memory cell array DMCA in the scribe region 2A is enlarged.

The silicide layer SI is not formed to the measurement pattern CP covered by the insulating film IF3. Then, the plugs PG are formed on the measurement patterns CP positioned near both edge portions in the Y direction. A part of the uppermost layer wiring among the multilayer wiring described above forms a pad electrode for coupling to a bonding wire and so forth. In the first embodiment, the plug on the measurement pattern CP is electrically coupled to the pad electrode.

Here, using a resistance meter like a probe, by contacting a terminal of the resistance meter like a probe needle onto the pad electrode, a resistance value in the Y direction of the measurement pattern CP covered by the insulating film IF3 can be measured.

Here, a length of the measurement pattern CP in the X direction can be calculated as a space between a couple of the stacked-layer bodies LP neighboring via the gate insulating film GI2. A length of the measurement pattern CP in the Y direction can be calculated as a space between a couple of the plugs PG. In other words, these spaces can be calculated based on setting values set in advance. Also, a sheet resistance of a material for forming the measurement pattern CP can be obtained in advance.

Therefore, based on measurement results of each of the lengths of the measurement pattern CP in the X direction and the Y direction, the resistance value in the Y direction of the measurement pattern CP, the sheet resistance, and the resistance value of the measurement pattern CP, a thickness of the measurement pattern CP can be calculated.

As described with reference to FIG. 6, the measurement pattern CP in the scribe region 2A and the conductive film CF1 to be the memory gate electrode MG in the product region 1A is set back at the same timing by an anisotropic etching. Therefore, based on a thickness of the calculated measurement pattern CP, a thickness of the memory gate electrode MG can be calculated.

In addition, there is a problem of variations in the thickness of the set back conductive film CF1 at near a center portion of the non-volatile memory cell array MCA and near an edge portion of the non-volatile memory cell array MCA. Thus, by calculating the thickness of the measurement pattern CP both positions near a center portion of the dummy memory cell array DMCA and near and edge portion of the dummy memory cell array DMCA, it is possible to calculate the thickness of the memory gate electrode MG near the center portion of the non-volatile memory cell array MCA and near the edge portion of the non-volatile memory cell array MCA.

Figure 19:
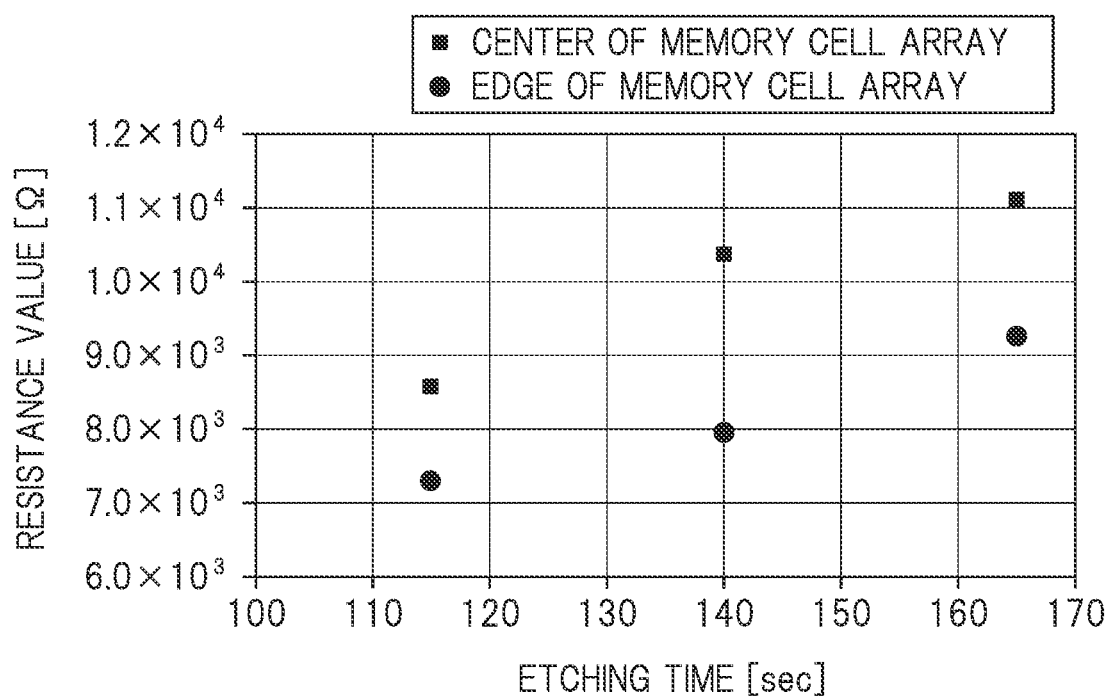
FIG. 19 is measurement data obtained by the inventors of the present invention.

FIG. 19 illustrates measurement data obtained by the inventors of the present application in which a relation between a resistance value and an etching time near the center portion and an edge portion of the dummy memory cell array DMCA, respectively.

According to the result in FIG. 19, even in the same etching time, the resistance value near the center portion of the dummy memory cell array DMCA is larger than that near the edge portion of the dummy memory cell array DMCA. In other words, it is understood that, near the center portion of the dummy memory cell array DMCA, progress of the etching of the conductive film CF1 is faster and thus the thickness of the conductive film CF1 is more easily reduced.

In this manner, according to the first embodiment, it is possible to monitor the thickness of the memory gate electrode MG (conductive film CF1) near the center portion and edge portion of the non-volatile memory cell array MCA based on the resistance value of the measurement pattern CP (conductive film CF1) of the dummy memory cell array DMCA without destroying the semiconductor substrate SUB. Therefore, it is possible to improve reliability of a semiconductor device.

Second Embodiment

Hereinafter, with reference to FIGS. 20 and 21, a semiconductor device according to a second embodiment will be described. Note that, in the following description, features different from those of the inductor element will be mainly described and descriptions of features overlapping those of the first embodiment will be omitted.

In the first embodiment, one type of the measurement pattern CP has been provided. However, in the second embodiment, a dummy memory cell DMC including two types of measurement patterns CP1 and CP2 as illustrated in FIGS. 20 and 21 is provided in the scribe region 2A. Note that, in FIGS. 20 and 21, to facilitate viewing of the length of each of the measurement patterns CP1 and CP2 in the X direction, illustrations of a part of the hatching and a part of the denotations are omitted.

Figure 20:
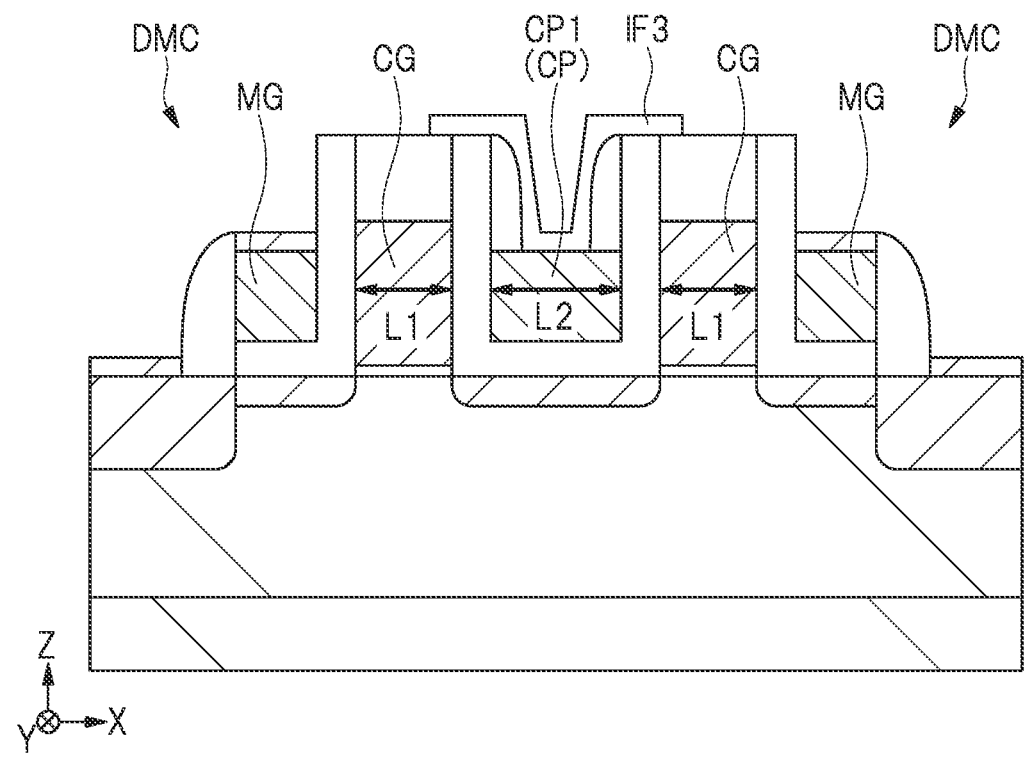
FIG. 20 is a cross-sectional view illustrating a dummy memory cell according to a second embodiment.
Figure 21:
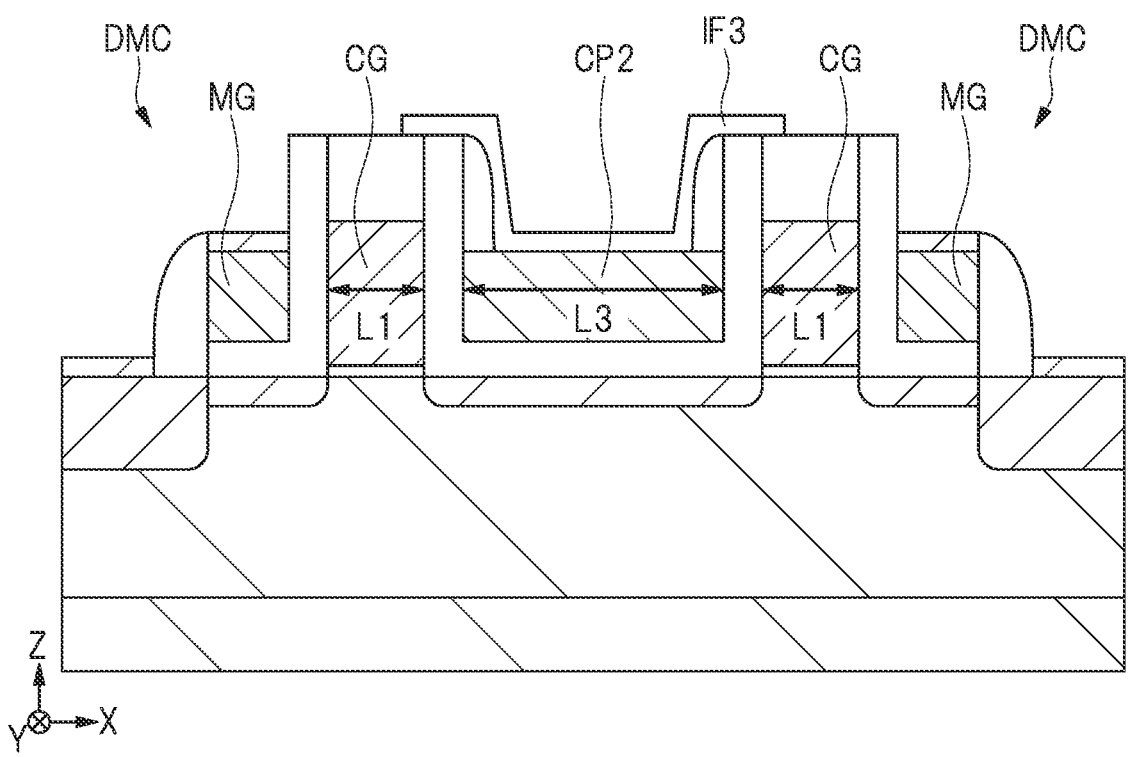
FIG. 21 is a cross-sectional view illustrating the dummy memory cell according to the second embodiment.

The dummy memory cell DMC illustrated in FIG. 20 is the same as the dummy memory cell DMC described in the first embodiment, and the measurement pattern CP1 is in the as the measurement pattern CP described in the first embodiment. In addition, the dummy memory cell DMC illustrated in FIG. 21 is the same as the dummy memory cell DMC illustrated in FIG. 20 except for a length of the measurement pattern CP2.

Here, in the X direction, a length L3 of the measurement pattern CP2 is larger than that of a length L2 of the measurement pattern CP1. For example, the length of the measurement pattern CP1 is twice as large as that of the measurement pattern CP1. In the following, descriptions will be made taking "L3=L2×2."

In each manufacturing step of the semiconductor device, an actual size of a structure may deviates from a designed value due to a dislocation of the mask and so forth. For example, in FIG. 20, when the length L1 in the X direction of the control gate electrode CG is larger than a designed value by 10 nm, the L2 of the measurement pattern CP1 positioned between a couple of control gate electrodes CG is smaller by 10 nm. In addition, in the same manner in FIG. 21, the length L3 of the measurement pattern CP2 is smaller by 10 nm.

In the second embodiment, such two measurement patterns CP1 and CP2 are prepared, resistance values of the measurement patterns CP1 and CP2 are separately calculated, and a difference in the resistance vales is calculated, thereby calculating the thickness of the measurement pattern CP1 and the thickness of the memory gate electrode MG.

For example, when there is no variation in the length L1, a resistance value $R_{(L2)}$ of the measurement pattern CP1 can be calculated from a difference between a resistance value $R_{(L2 \times 2)}$ of the measurement pattern CP2 and a resistance $R_{(L2)}$ of the measurement pattern CP1.

When there are variations in the length L1 and the length L1 is 10 nm longer, the resistance value $R_{(L2)}$ of the measurement pattern CP1 can be calculated from a difference between the resistance value $R_{(L2 \times 2-10)}$ of the measurement pattern CP2 and the resistance value $R_{(L2-10)}$ of the measurement pattern CP1.

IN this manner, according to second embodiment, even when there are variations in the length L1, the resistance value $R_{(L2)}$ of the measurement pattern CP1 can be calculated by the two types of measurement patterns CP1 and CP2. Based on the result, the thickness of the measurement pattern CP1 can be calculated, and the thickness o the memory gate electrode MG can be calculated.

FIG. 20 illustrates a part of a method of manufacturing the semiconductor device according to the second embodiment. Although the method of manufacturing the semiconductor device of the second embodiment is almost the same as that of the first embodiment, a device for not letting the measurement pattern CP2 exposed is required. A reason is that the measurement pattern CP2 is patterned upon forming the memory gate electrode MG when the measurement pattern CP2 is exposed.

Figure 22:
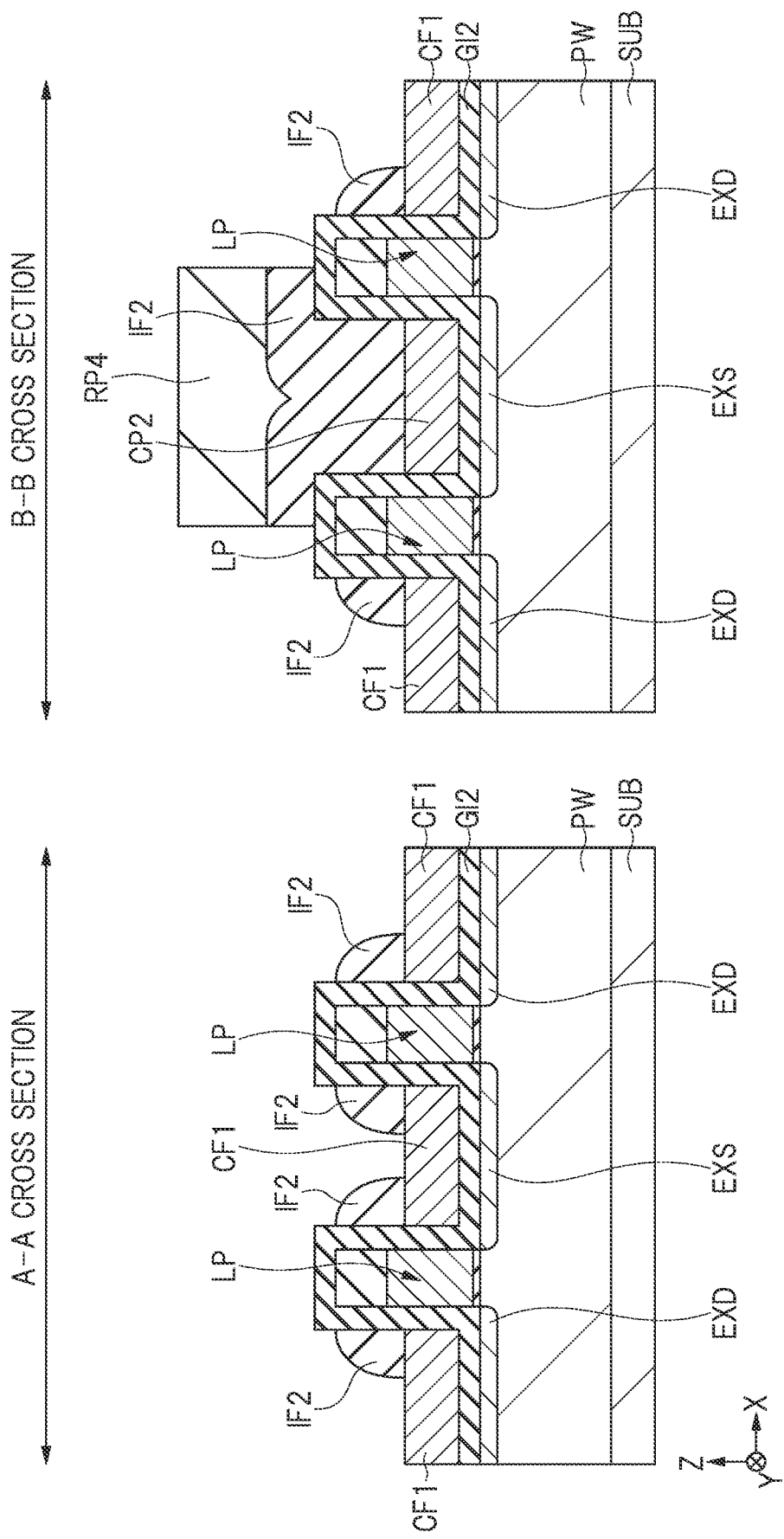
FIG. 22 is a cross-sectional view illustrating a manufacturing step of a semiconductor according to the second embodiment.

The method of manufacturing the semiconductor device in the second embodiment is the same as that of the first embodiment in accordance with FIGS. 3 to 7. After the manufacturing step in FIG. 7, as illustrated in FIG. 22, a resist pattern RP4 is formed so as to covered by the insulating film IF2 on the measurement pattern CP2. In that state, by performing the anisotropic etching in FIG. 8, the insulating film IF2 is left on the measurement pattern CP CP2. The manufacturing processes thereafter are same as those in FIGS. 9 to 17.

Figure 23:
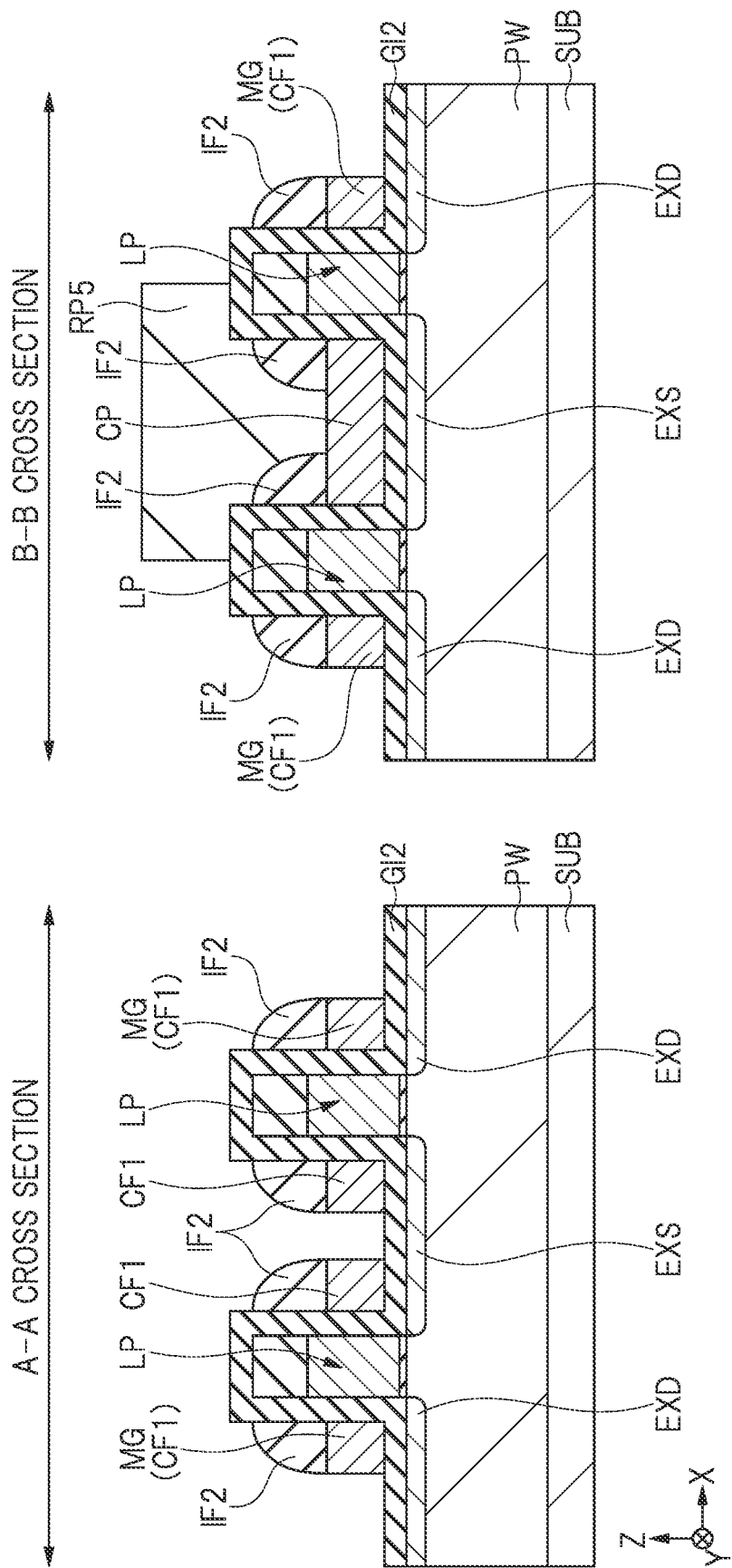
FIG. 23 is a cross-sectional view illustrating a manufacturing step of the semiconductor device according to the second embodiment.

FIG. 23 illustrates a part of the method of manufacturing a semiconductor device that is different from FIG. 22. The method of manufacturing in FIG. 23 is the same as that the first embodiment illustrated in FIGS. 3 to 8. After the manufacturing process in FIG. 8, as illustrated in FIG. 23, a resist pattern RP5 is formed so as to cover the measurement pattern CP2 and the insulating film IF2 processed to have a shape of sidewall spacer. In this state, by performing the anisotropic etching in FIG. 9, the memory gate electrode MG can be formed while protecting the measurement pattern CP2. Subsequent manufacturing processes are the same as those illustrated in FIGS. 10 to 17.

In this manner, it is possible to form the measurement pattern CP2 having a larger length in the X direction. Note that, it is needless to say that the silicide layer SI is not formed on the measurement pattern CP2 since the measurement pattern CP2 is covered by the insulating film IF3.

Third Embodiment

Hereinafter, a semiconductor device according to a third embodiment will be described with reference to FIG. 24. Note that, in the following descriptions, features different from the first embodiment will be mainly described and descriptions of features overlapping those of the first embodiment are omitted.

In the first embodiment a terminal of the resistance meter like a probe needle is put into contact with the pad electrode that is a part of the uppermost layer of the wiring to measure the resistance value in the Y direction of the control unit CP. In the third embodiment, the resistance value is measured by put the terminal of the resistance meter in contact with a pad region PAD that is integrated with the measurement pattern CP.

Figure 24:
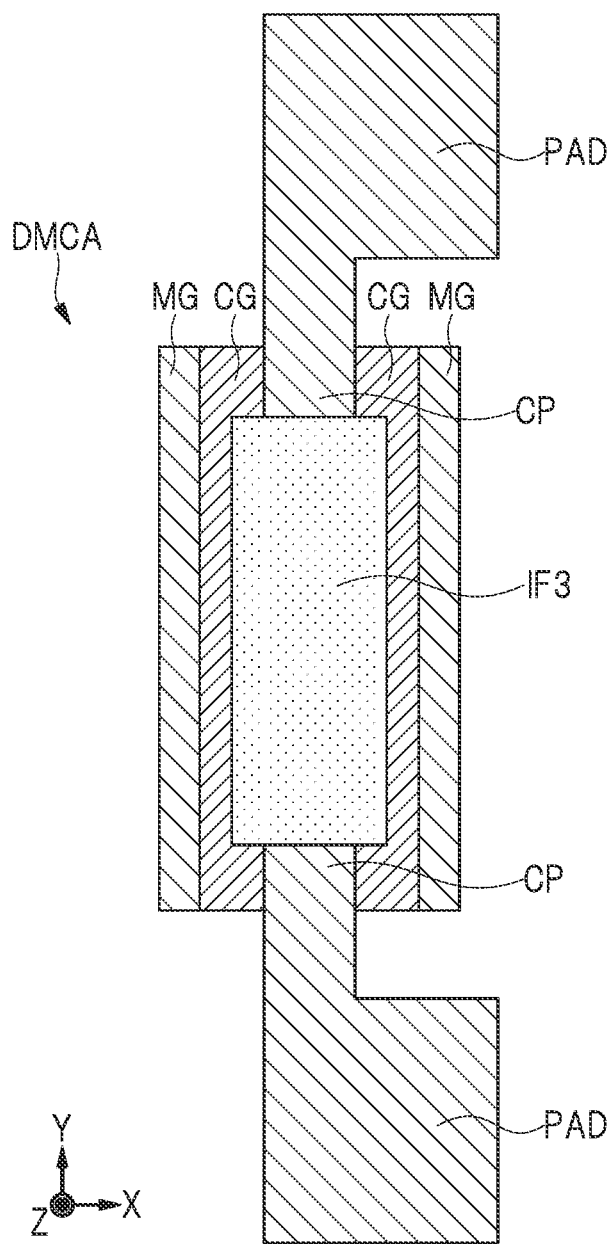
FIG. 24 is a plan view illustrating a part of a dummy memory cell array according to a third embodiment.

As illustrated in FIG. 24, at both edge portions in the Y direction of the measurement pattern CP, the pad regions PAD formed of the conductive film CF1 and coupled to the measurement pattern CP are formed, respectively. In other words, the pad regions PAD are integrated with the measurement pattern CP and formed of the conductive film CF in the same layer as the measurement pattern CP.

In addition, in the X direction, a length of the pad region PAD is larger than that of the measurement pattern CP. Thus, an enough space is ensured for contacting the terminal of the resistance meter.

There has been a necessity of forming a multilayer wiring to measure the resistance in the first embodiment. On the contrary, since such a pad region PAD is formed in the same layer as the measurement pattern CP in the third embodiment, it is possible to measure the resistance value without forming a multilayer wiring. In other words, it is possible to measure instantly in-line according to the third embodiment.

Note that the technique disclosed in the third embodiment and the technique disclosed in the second embodiment may be performed in combination.

Fourth Embodiment

Hereinafter, a semiconductor device according to a fourth embodiment will be described with reference to FIGS. 25 and 26. Note that, in the following descriptions, features different from the first embodiment will be mainly described and descriptions of features overlapping those of the first embodiment are omitted.

In the fourth embodiment, the measurement pattern CP is divided into two patterns and a resistance value is measured by using at least one of the two patterns.

Figure 25:
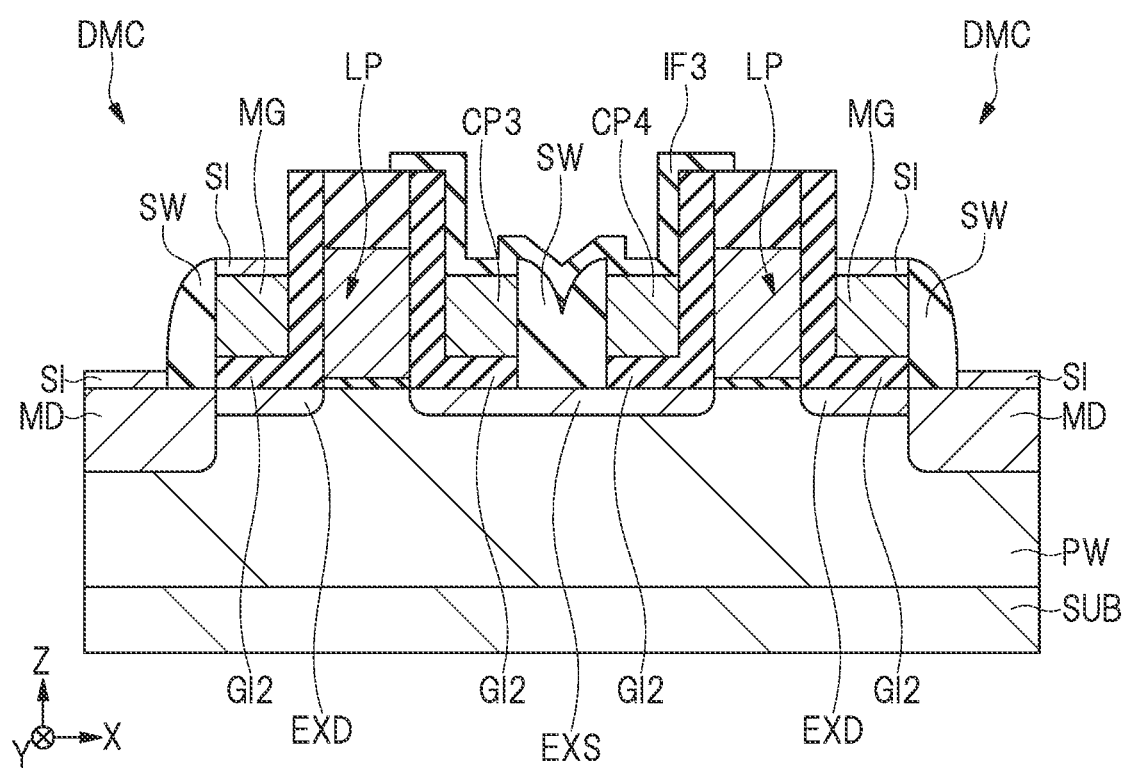
FIG. 25 is a cross-sectional view illustrating the dummy memory cell according to a fourth embodiment.

As illustrated in FIG. 25, divided patterns measurement pattern CP3 and measurement pattern CP4 are positioned between a couple of the stacked-layer bodies LP. The measurement pattern CP3 is positioned on the side of one of the stacked-layer bodies LP and the measurement pattern CP4 is positioned on the side of the other of the stacked-layer bodies LP. In addition, since the measurement pattern CP3 and the measurement pattern CP4 are covered by the insulating film IF3, the silicide layer SI is not formed on each upper surface of the measurement pattern CP3 and the measurement pattern CP4.

Lengths in the X direction of the measurement pattern CP3 and the measurement pattern CP4 can be measured by an in-line length measurement SEM (scanning electron microscope) and so forth. Thus, in the same manner as the first embodiment, resistance values of the measurement pattern CP3 and the measurement pattern CP4 are measured and a thickness of the memory gate electrode MG can be calculated by calculating thicknesses of the measurement pattern CP3 and the measurement pattern CP4 from the resistance value.

To form such the measurement pattern CP3 and the measurement pattern CP4, first, two stacked-layer bodies LP are formed to make a space between the couple of stacked-layer bodies LP is larger than that of the first embodiment. Then, in the same manner as the process of forming the memory gate electrode MG illustrated in FIGS. 7 to 9, the measurement pattern CP between the couple of stacked-layer bodies LP is patterned, and thus it is possible of forming the measurement pattern CP3 and the measurement pattern CP4. The subsequent manufacturing processes are the same manner as those illustrated in FIGS. 10 to 17.

Note that the technique disclosed in the fourth embodiment and the techniques disclosed in the second embodiment and the third embodiment may be performed in combination.

While the present invention has been described specifically based on the embodiment, the present invention is not limited to the embodiments and it is needless to say that the invention can be variously modified within the scope of the invention.

The invention claimed is:

1. A method of manufacturing a semiconductor device using a semiconductor substrate having a product region for forming a semiconductor element and a scribe region surrounding the product region, the method comprising the steps of:

(a) forming, in the product region and the scribe region, a first gate insulating film on the semiconductor substrate and forming a first gate electrode extended in a first direction in a plan view on the first gate insulating film, thereby forming a stacked-layer body including the first gate insulating film and the first gate electrode;

(b) after the step (a), forming a second gate insulating film on the semiconductor substrate in the product region and the scribe region so as to cover the stacked-layer body;

(c) after the step (b), forming a first conductive film on the second gate insulating film in the product region and the scribe region so as to cover the stacked-layer body via the second gate insulating film;

(d) after the step (c) performing an etching process to the first conductive film in the product region and the scribe region so as to make a position of an upper surface of the first conductive film lower than that of an upper layer of the stacked-layer body, thereby forming a first measurement pattern that is formed of the first conductive film in the scribe region and extended in the first direction;

(e) after the step (d), forming a second gate electrode that is formed of the first conductive film in the product region and extended in the first direction by patterning the first conductive film in the product region;

(f) after the step (e), forming a first insulating film so as to cover at least an upper surface of the second gate electrode in the product region and an upper surface of the first measurement pattern in the scribe region;

(g) after the step (f), patterning the first insulating film so as to expose the upper surface of the second gate electrode in the product region and to cover the upper surface of the first measurement pattern;

(h) after the step (g), forming a silicide layer on the upper surface of the second gate electrode in the product region in a state where the upper surface of the first measurement pattern is covered by the first insulating film; and (i) after the step (h), measuring a resistance value in the first direction of the first measurement pattern that is covered by the first insulating film.

2. The method of manufacturing a semiconductor device according to claim 1, wherein, in the step (a), in the scribe region, a first stacked-layer body and a second stacked-layer body are formed so as to put them next to each other in a second direction that is crossing the first direction in a plan view, and the first measurement pattern is formed between the first stacked-layer body and the second stacked-layer body.

3. The method of manufacturing a semiconductor device according to claim 2, wherein, in the step (a), in the scribe region, a third stacked-layer body and a fourth stacked-layer body are formed so as to put them next to each other in the second direction, in the step (d), a second measurement pattern that is formed of the first conductive film, extended in the first direction and formed between the third stacked-layer body and the fourth stacked-layer body, after the steps (f), (g) and (h), an upper surface of the second measurement pattern is covered by the first insulating film and a length of the second measurement pattern longer than that of the first measurement pattern in the second direction, and the method further includes the steps of:

(j) measuring a resistance value in the first direction of the second measurement pattern that is covered by the first insulating film after the step (h); and (k) calculating a difference between the resistance value of the second measurement pattern and that of the first measurement pattern after the steps (i) and (j).

4. The method of manufacturing a semiconductor device according to claim 2, wherein, in the step (e), by also patterning the first measurement pattern in the scribe region, the first measurement pattern is divided into a first pattern positioned on the first stacked-layer body side and a second pattern positioned on the second stacked-layer body side.

5. The method of manufacturing a semiconductor device according to claim 1, wherein, the step (e) includes the steps of:

(e1) forming a second insulating film on the first conductive film in the product region and the scribe region so as to cover the stacked-layer body that protrudes from the upper surface of the first conductive film;

(e2) after the step (e1), in the product region and the scribe region, performing an anisotropic etching to the second insulating film, thereby leaving the second insulating film in a shape of sidewall spacer on a side surface of the stacked-layer body and on the upper surface of the first conductive film in the product region and on a side surface of the stacked-layer body and on the upper surface of the first measurement pattern in the scribe region; and (e3) after the step (e2), performing an anisotropic etching using the second insulating film as a mask in a state where the first measurement pattern in the scribe region is covered by the second insulating film or a resist pattern, thereby selectively patterning the first conductive film in the product region.

6. The method of manufacturing a semiconductor device according to claim 1, wherein a pad region coupled to the first measurement pattern and formed of the first conductive film is formed at both edge portions in the first direction of the first measurement pattern, a length of the pad region is longer than that of the first measurement pattern in a second direction that is crossing the first direction in a plan view, and measurement in the step (i) is performed by contacting a terminal of a resistance meter onto the two pad regions.

7. The method of manufacturing a semiconductor device according to claim 1, wherein, in the step (a), a third insulating film is formed on the first gate electrode, and the stacked-layer body includes the first gate insulating film, the first gate electrode, and the third insulating film.

8. The method of manufacturing a semiconductor device according to claim 1, wherein the etching process in the step (d) includes the steps of:

(d1) performing a polishing process to the first co conductive film so that the first conductive film on the upper surface of the stacked-layer body is removed; and (d2) performing an anisotropic etching to the first conductive film so as to make the position of the upper surface of the first conductive film lower than that of the upper surface of the stacked-layer body.

9. The method of manufacturing a semiconductor device according to claim 1, wherein the first conductive film is formed of polycrystalline silicon.

10. The method of manufacturing a semiconductor device according to claim 1, wherein the second gate insulating film is formed of a stacked-layer film including a first silicon oxide film, a charge-accumulating film, and a second silicon oxide film, and the semiconductor element in the product region is a non-volatile memory cell including the first gate electrode, the first gate insulating film, the second gate electrode, and the second gate insulating film.

* * * * *